United States Patent
Zietz et al.

(10) Patent No.: US 9,921,287 B2
(45) Date of Patent: Mar. 20, 2018

(54) METHOD FOR CALIBRATING A TEST RIG

(71) Applicant: ROSENBERGER HOCHFREQUENZTECHNIK GMBH & CO. KG, Fridolfing (DE)

(72) Inventors: Christian Zietz, Lippstadt (DE); Dominic Haerke, Pattensen (DE)

(73) Assignee: Rosenberger Hochfrequenztechnik GmbH & Co. KG, Fridolfing (DE)

(*) Notice: Subject to any disclaimer, the term of this patent is extended or adjusted under 35 U.S.C. 154(b) by 155 days.

(21) Appl. No.: 14/914,181

(22) PCT Filed: Aug. 25, 2014

(86) PCT No.: PCT/EP2014/002320
§ 371 (c)(1),
(2) Date: Feb. 24, 2016

(87) PCT Pub. No.: WO2015/028139
PCT Pub. Date: Mar. 5, 2015

(65) Prior Publication Data
US 2016/0209488 A1 Jul. 21, 2016

(30) Foreign Application Priority Data
Aug. 26, 2013 (DE) .................. 10 2013 014 175

(51) Int. Cl.
*G01R 35/00* (2006.01)
*G01R 27/32* (2006.01)

(52) U.S. Cl.
CPC ............ *G01R 35/005* (2013.01); *G01R 27/32* (2013.01)

(58) Field of Classification Search
CPC ............... G01R 35/005; G01R 27/32
(Continued)

(56) References Cited

U.S. PATENT DOCUMENTS 6,081,125 A 6/2000 Krekels
6,917,892 B2 7/2005 Bradley
(Continued)

FOREIGN PATENT DOCUMENTS

CN 102279376 A 12/2011
CN 102981135 A 3/2013
(Continued)

OTHER PUBLICATIONS

Uwe Siart; "Calibration of Network Analysers"; Jan. 4, 2012 (Version 1.51); http://www.siart.de/lehre/nwa.pdf.
(Continued)

*Primary Examiner* — Harry W Byrne
(74) *Attorney, Agent, or Firm* — DeLio, Peterson & Curcio LLC; Robert Curcio

(57) ABSTRACT

A method for calibrating a test apparatus, having a first and a second directional coupler, for gauging a two-port test object that has a first port and a second port in a calibration plane, wherein for the purpose of calibrating the test apparatus a vectorial network analyzer having a 1st-6th test port is connected to the first and second ports in the calibration plane such that the first and second test ports are connected to respective port in the calibration plane, the third and fourth test ports are connected to the first directional coupler and the fifth and sixth test ports are connected to the second directional coupler via a respective waveguide for electromagnetic waves. For different calibration standards, scatter parameters are determined for each desired frequency point. For the different calibration standards, corrections to the scatter matrix are made in order to obtain a corrected scatter matrix. The scatter parameters of the corrected scatter matrix are used to determine terms for error matrices.

12 Claims, 5 Drawing Sheets

(58) Field of Classification Search
USPC .......................................................... 702/106
See application file for complete search history.

(56) References Cited

U.S. PATENT DOCUMENTS

| | | | | |
|---|---|---|---|---|
| 7,235,982 B1* | 6/2007 | Shoulders | .............. | G01R 27/28 324/601 |
| 2005/0258815 A1* | 11/2005 | Shoulders | .............. | G01R 27/28 324/76.23 |
| 2008/0191712 A1* | 8/2008 | Eisenstadt | .............. | G01R 27/28 324/638 |
| 2008/0204039 A1 | 8/2008 | Wong | | |
| 2010/0141305 A1* | 6/2010 | Ortler | .................... | G01R 27/28 327/117 |
| 2011/0288800 A1* | 11/2011 | Kondo | .................... | G01R 27/28 702/66 |
| 2012/0109566 A1 | 5/2012 | Adamian | | |
| 2014/0306719 A1* | 10/2014 | Dunsmore | ........... | G01R 35/005 324/601 |

FOREIGN PATENT DOCUMENTS

| | | |
|---|---|---|
| DE | 4401068 A1 | 3/1995 |
| DE | 102012006314 A1 | 10/2013 |
| WO | 20030048791 A2 | 6/2003 |
| WO | 2012105127 A1 | 8/2012 |

OTHER PUBLICATIONS

D. Root et al: "X-Parameter: The new paradigm for describing non-linear RF and microwave components". In: tm—Technisches Messen No. 7-8, vol. 77, 2010.

Hiebel, Michael: Basic Principles of Vectorial Network Analysis. 1st edition, Rohde & Schwarz GmbH & Co. KG, 2006.

Eul, H.-J. ; Schiek, B.: "A generalized theory and new calibration procedures for network analyzer self-calibration", In: Microwave Theory and Techniques, IEEE transactions on 39 (1991), Apr., No. 4, p. 724-731, http://dx.doi.org/10.1109/22.76439—DOI 10.1109/22.76439—ISSN 0018-9480.

Engen, G.F.; Hoer, C.A.: Thru-Reflect-Line: An Improved Technique for Calibrating the Dual Six-Port Automatic Network Analyzer. In: Microwave Theory and Techniques, IEEE transactions on 27 (1979), Dec., No. 12, p. 987-993, http://dx.doi.org/10.1109/TMTT.1979.1129778—DOI 10.1109/TMTT.1979.1129778—ISSN 001 8-9480.

Marks, Roger B., "Formulations of the Basic Vector Network Analyzer Error Model including Switch Terms", ARFTG Conference Digest Fall, 50th vol. 32, 1997, p. 115-126.

Schiek, Burkhard, "Basic Principles of High Frequency Measuring Technology", 1st ed., Springer-Verlag, 1999, pp. 158-173.

Ferraro, A. "A New Implementation of a Multipart Automatic Network Analyzer" 1992 IEEE, pp. 2078-2085.

Hu, J. "Calibrated Non-Linear Vector Network Measurement Without Using a Multi-Harmonic Generator", IET Microwaves Antennas & Propagation, vol. 5, No. 5, Apr. 11, 2011, pp. 616-624.

Heuermann, H.: "Calibration of a Network Analyzer Without a Thru Connection for Nonlinear and Multiport Measurements", IEEE Transactions on Microwave Theory and Techniques, vol. 56, No. 11, Nov. 1, 2008 (Nov. 1, 2008), pp. 2505-2510, XP011236944.

Zelder. T., et al: "Contactless network analysis system for the calibrated measurement of the scattering parameters of planar two-port devices", Microwave Conference, 2007. European, IEEE, PI Oct. 1, 2007 (Oct. 1, 2007), pp. 246-249, XP031191780.

Abouchahine, M., et al: "Broadband Time-Domain Measurement System for the Characterization of Nonlinear Microwave Devices With Memory", IEEE Transactions on Microwave Theory and Techniques, vol. 58, No. 4, Apr. 1, 2010 (Apr. 1, 2010), pp. 1038-1045, XP011304549.

Ferrari, Philippe [et al.]: A complete calibration procedure for time domain network analyzers. In: Microwave Symposium Digest, 1992, IEEE MTT-S International, Jun. 1-5, 1992, vol. 3, S. 1451-1454.

\* cited by examiner

METHOD FOR CALIBRATING A TEST RIG

BACKGROUND OF THE INVENTION

1. Field of the Invention

The present invention relates to a method for calibrating a test apparatus, having a first and a second directional coupler, for testing a two-port test object (DUT—Device Under Test).

2. Description of Related Art

One of the most important measuring tasks in high frequency and microwave technology involves the measurement of reflection coefficients or generally—in the case of multiports—the measurement of scatter parameters. The linearly-describable network behavior of a device under test (DUT) is characterized through the scatter parameters. Frequently, it is not only the scatter parameters at a single measuring frequency which are of interest, but their frequency-dependency over a finitely broad measuring bandwidth. The associated measuring method is referred to as network analysis. Depending on the importance of the phase information in the measuring task in question, the scatter parameters can either be measured solely in terms of amount or also as a complex measurement. In the first case one speaks of scalar network analysis, in the second case of vectorial network analysis. Depending on the method, number of ports and measuring frequency range, the network analyzer is a more or less complex system consisting of test signal source and receivers which function according to the homodyne or the heterodyne principle. Because the measuring signals have to be fed to the device under test and back again through cables and other components with unknown and non-ideal properties, in addition to random errors, system errors also occur in network analysis. Through calibration measurements, the aim of which is to determine as many as possible of the unknown parameters of the test apparatus, the system errors can, within certain limits, be reversed. Very many methods and strategies exist here which differ considerably in the scope of the error model and thus in complexity and efficiency. (Uwe Siart; "Calibration of Network Analysers"; 4 Jan. 2012 (Version 1.51); http://www.siart.de/lehre/nwa.pdf).

However, scatter parameters measured in such a calibrated manner only fully describe linear, time-invariant devices under test. The X parameters represent an expansion of the scatter parameters to non-linear devices under test (D. Root et al: "X-Parameter: The new paradigm for describing non-linear RF and microwave components". In: tm—Technisches Messen No. 7-8, Vol. 77, 2010), which are also defined through the frequency. However, each device under test can also be described through measurement of the currents and voltages or the absolute wave quantities at its ports within the time domain. The measurement in the time domain inherently includes all spectral components resulting for example from the non-linearity as well as the change over time of the device under test or its input signals. Such a time domain measurement also requires calibration. However, in order to measure absolute values the aforementioned calibration methods cannot be applied without modification, since they only permit the determination of relative values (scatter parameters).

Since the use of an extremely wide variety of non-linear components is indispensable in the field of high frequency technology it is of great interest to be able to describe the behavior of such circuit elements. With a model similar to the scatter parameters for linear component behavior, the non-linearities could then be taken into account in advance in circuit simulations. In order to obtain correct and reliable results it is necessary first to calibrate this test setup. A calibration serves to eliminate the system errors which necessarily occur in non-ideal measurements. This ensures that the final results only describe the behavior of the device under test (DUT) and do not contain any influences such as, for example, frequency-dependent damping, for example of supply cables or other elements of the setup.

SUMMARY OF THE INVENTION

The invention is based on the problem of developing a time-domain measuring method for non-linear components, the outputs of which can be used to create a model which makes it possible to take non-linearities into account in advance in circuit simulations.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
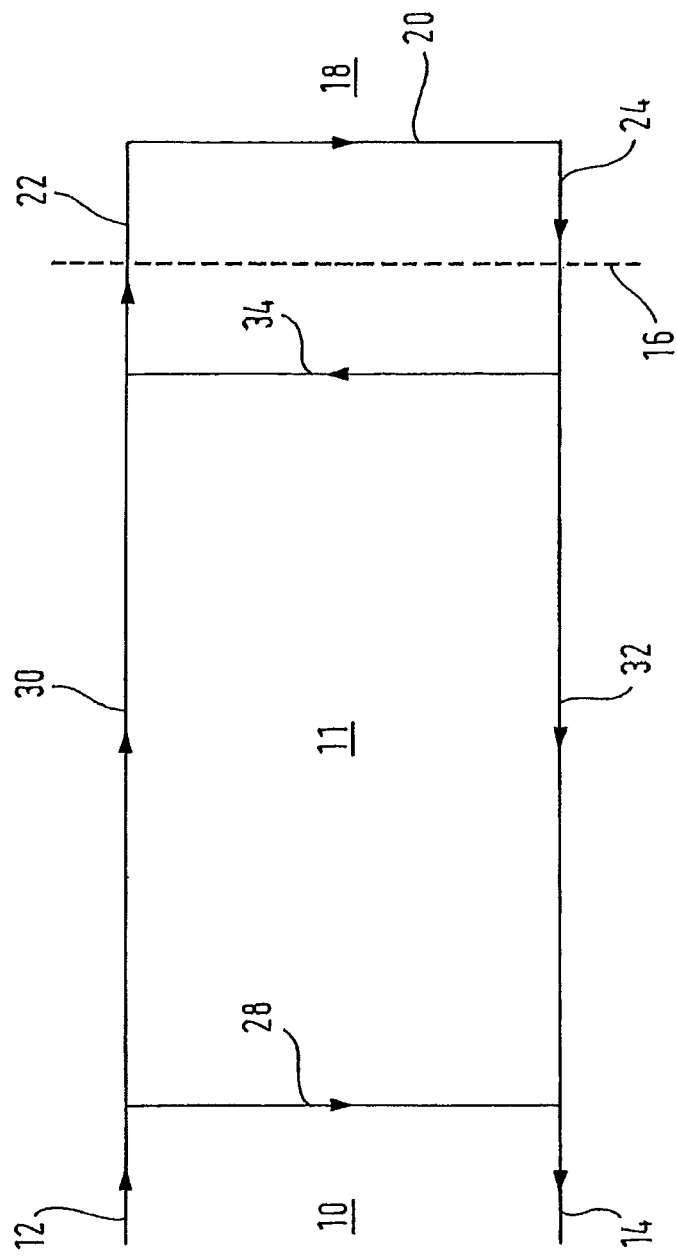
FIG. 1 shows a schematic signal flow diagram of an error two-port between a test port of a vectorial network analyzer and a device under test (DUT) for a one-port measurement.

In describing the preferred embodiment of the present invention, reference will be made herein to FIGS. 1-5 of the drawings in which like numerals refer to like features of the invention.

In order to determine the system errors of a test apparatus or a test setup, it is necessary to determine its error terms. The error terms are usually stated in the form of a matrix, the error matrix. This describes the two-port between the test apparatus and the system plane up to which calibration is to be carried out (calibration plane). The calibration plane usually coincides with the input port of the device under test (DUT). During the course of a calibration, in most cases three (in some methods also four or five) different calibration standards are measured with a VNA. Depending on the calibration method, different properties of the standards are specified (HIEBEL, Michael: Basic Principles of Vectorial Network Analysis. 1st edition, Rohde & Schwarz GmbH & Co. KG, 2006). After the error terms have first been determined on the basis of the measuring results of the individual calibration steps, these can then be used for a correction calculation which frees the measurements carried out on the DUTs of system errors.

The test apparatus of the present invention includes a first port and a second port in a calibration plane; wherein for the purpose of calibrating the test apparatus a vectorial network analyzer (VNA) having a first, a second, a third, a fourth, a fifth and a sixth test port is connected to the first and second ports in the calibration plane such that the first test port is connected to the first port in the calibration plane, the second test port is connected to the second port in the calibration plane, the third and fourth test ports are connected to the first directional coupler and the fifth and sixth test ports are connected to the second directional coupler via a respective waveguide for electromagnetic waves;

wherein at the first test port an electromagnetic wave $a_1$ runs out in the direction of the first port in the calibration plane and an electromagnetic wave $b_1$ runs in from the direction of the first port in the calibration plane;

wherein at the second test port an electromagnetic wave $a_2$ runs out in the direction of the second port in the calibration plane and an electromagnetic wave $b_2$ runs in from the direction of the second port in the calibration plane;

wherein at the first port in the calibration plane an electromagnetic wave $a_{DUT,1}$ runs in from the direction of the first test port and an electromagnetic wave $b_{DUT,1}$ runs out in the direction of the first test port;

wherein at the second port in the calibration plane an electromagnetic wave $a_{DUT,2}$ runs in from the direction of the second test port and an electromagnetic wave $b_{DUT,2}$ runs out in the direction of the second test port;

wherein between the first test port and the first port in the calibration plane a component of the wave $a_1$ is coupled out by the first directional coupler as $a_{Mess,1}$ and fed to the third test port of the VNA;

wherein between the first test port and the first port in the calibration plane a component of the wave $b_1$ is coupled out by the first directional coupler as $b_{Mess,1}$ and fed to the fourth test port of the VNA;

wherein between the second test port and the second port in the calibration plane a component of the wave $a_2$ is coupled out by the second directional coupler as $a_{Mess,2}$ and fed to the fifth test port of the VNA;

wherein between the second test port and the second port in the calibration plane a component of the wave $b_2$ is coupled out by the second directional coupler as $b_{Mess,2}$ and fed to the sixth test port of the VNA;

wherein in order to calibrate the test apparatus, instead of the DUT at least three different calibration standards are arranged in the calibration plane;

wherein for each calibration standard K and for each desired frequency point of a frequency f of $a_1$ or $a_2$ scatter parameters $S_{xy,K,f}$, where x=1, 2, 3, 4, 5 or 6 and y=1 or 2, are determined between the y-th and the x-th test port of the VNA for the calibration standard K and the frequency f is determined from the known values $a_{1,K,f}$ and $a_{2,K,f}$ as well as from the measured values $b_{1,K,f}$, $b_{2,K,f}$, $a_{Mess,1,K,f}$, $b_{Mess,1,K,f}$, $a_{Mess,2,K,f}$, $b_{Mess,2,K,f}$ whereby $$\begin{bmatrix} b_{1,K,f} \\ b_{2,K,f} \end{bmatrix} = \begin{bmatrix} S_{11,K,f} & S_{12,K,f} \\ S_{21,K,f} & S_{22,K,f} \end{bmatrix} \begin{bmatrix} a_{1,K,f} \\ a_{2,K,f} \end{bmatrix}$$

$$\begin{bmatrix} a_{Mess,1,K,f} \\ b_{Mess,1,K,f} \end{bmatrix} = \begin{bmatrix} S_{31,K,f} & S_{32,K,f} \\ S_{41,K,f} & S_{42,K,f} \end{bmatrix} \begin{bmatrix} a_{1,K,f} \\ a_{2,K,f} \end{bmatrix}$$

-continued $$\begin{bmatrix} a_{Mess,2,K,f} \\ b_{Mess,2,K,f} \end{bmatrix} = \begin{bmatrix} S_{51,K,f} & S_{52,K,f} \\ S_{61,K,f} & S_{62,K,f} \end{bmatrix} \begin{bmatrix} a_{1,K,f} \\ a_{2,K,f} \end{bmatrix}$$

wherein a scatter matrix $S_{unkorr,K,f}$ $$S_{unkorr,K,f} = \begin{bmatrix} S_{11,unkorr,K,f} & S_{12,unkorr,K,f} \\ S_{21,unkorr,K,f} & S_{22,unkorr,K,f} \end{bmatrix},$$

describing the transmission via the directional coupler is calculated from the measured scatter parameters $S_{xy,K,f}$ of the calibration standards, where x=3, 4, 5, 6 and y=1, 2, with scatter parameters $S_{11,unkorr,K,f}$, $S_{12,unkorr,K,f}$, $S_{21,unkorr,K,f}$ and $S_{22,unkorr,K,f}$, according to $$S_{11,unkorr,K,f} = \frac{b_{Mess,1,K,f}}{a_{Mess,1,K,f}} = \frac{S_{41,K,f}}{S_{31,K,f}} = \sigma_{11}$$

$$S_{21,unkorr,K,f} = \frac{b_{Mess,2,K,f}}{a_{Mess,1,K,f}} = \frac{S_{61,K,f}}{S_{31,K,f}} = \sigma_{21}$$

$$S_{12,unkorr,K,f} = \frac{b_{Mess,1,K,f}}{a_{Mess,2,K,f}} = \frac{S_{42,K,f}}{S_{52,K,f}} = \sigma_{12}$$

$$S_{22,unkorr,K,f} = \frac{b_{Mess,2,K,f}}{a_{Mess,2,K,f}} = \frac{S_{62,K,f}}{S_{52,K,f}} = \sigma_{22}$$

whereby a scatter matrix $S_{I,K,f}$ describing the transmission between the first test port of the VNA and the first port in the calibration plane on the one hand, as well as between the second test port of the VNA and the second port in the calibration plane on the other hand, is determined with the measured scatter parameters $S_{xy,K,f}$ of the calibration standards, where x=1, 2 and y=1, 2, as $$S_{I,K,f} = \begin{bmatrix} S_{11,K,f} & S_{12,K,f} \\ S_{21,K,f} & S_{22,K,f} \end{bmatrix}$$

whereby, with the measured scatter parameters $S_{xy,K,f}$ of the scatter matrix $S_{I,K,f}$, where x=1, 2 and y=1, 2, terms $i_{00}$, $i_{01} \cdot i_{10}$ and $i_{11}$ of an error matrix $I_A$ with $$I_A = \begin{bmatrix} i_{00} & i_{01} \\ i_{10} & i_{11} \end{bmatrix}$$

are determined for a signal transmission between the first test port on the one hand and the first port in the calibration plane on the other hand depending on a frequency f of the waves $a_1$ or $a_2$ by means of a predetermined calibration algorithm, where $I_A$ is a scatter matrix according to $$\begin{bmatrix} b_1 \\ a_{DUT,1} \end{bmatrix} = I_A \begin{bmatrix} a_1 \\ b_{DUT,1} \end{bmatrix}$$

whereby, with the measured scatter parameters $S_{xy,K,f}$ of the scatter matrix $S_{I,K,f}$, where x=1, 2 and y=1, 2, terms $i_{22}$, $i_{23} \cdot i_{32}$ and $i_{33}$ of an error matrix $I_B$ with $$I_B = \begin{bmatrix} i_{22} & i_{23} \\ i_{32} & i_{33} \end{bmatrix}$$

are determined for a signal transmission between the second test port on the one hand and the second port in the calibration plane on the other hand depending on a frequency f of the waves $a_1$ or $a_2$ by means of a predetermined calibration algorithm, whereby $I_B$ is a scatter matrix according to $$\begin{bmatrix} a_{DUT,2} \\ b_2 \end{bmatrix} = I_B \begin{bmatrix} b_{DUT,2} \\ a_2 \end{bmatrix}$$

as described in the claims.

In a method of the aforementioned type, according to the invention, for each frequency step with the frequency f of $a_1$ or $a_2$ and for each calibration standard K a correction of the scatter matrix $S_{unkorr,K,f}$ is carried out to produce a corrected scatter matrix $S_{c,K,f}$ according to the formula $$S_{c,K,f} = \frac{1}{D} \begin{bmatrix} \sigma_{11} - \sigma_{12}\sigma_{21}\Gamma_{F,K,f} & \sigma_{12} - \sigma_{11}\sigma_{12}\Gamma_{F,K,f} \\ \sigma_{21} - \sigma_{22}\sigma_{21}\Gamma_{F,K,f} & \sigma_{22} - \sigma_{12}\sigma_{21}\Gamma_{F,K,f} \end{bmatrix}$$

where $D = 1 - \rho_{12}\rho_{21}\Gamma_{F,K,f}\Gamma_{R,K,f}$, and $$\Gamma_{F,K,f} = \frac{S_{51,K,f}}{S_{61,K,f}}$$

describes the ratio of propagated to reflected wave measured at the output of the second directional coupler on feeding through the first test port of the VNA and $$\Gamma_{R,K,f} = \frac{S_{32,K,f}}{S_{42,K,f}}$$

describes the ratio of propagated to reflected wave measured at the output of the first directional coupler on feeding through the second test port of the VNA;

whereby, with the scatter parameters of the scatter matrix $S_{c,K,f}$, terms $e_{00}$, $e_{01} \cdot e_{10}$ and $e_{11}$ of an error matrix $$E_A = \begin{bmatrix} e_{00} & e_{01} \\ e_{10} & e_{11} \end{bmatrix}$$

are determined for a signal transmission between the third and fourth test port on the one hand and the first port in the calibration plane on the other hand depending on a frequency f of the waves $a_1$ or $a_2$ by means of a predetermined calibration algorithm, where $E_A$ is a scatter matrix according to $$\begin{bmatrix} b_{Mess,1} \\ a_{DUT,1} \end{bmatrix} = E_A \begin{bmatrix} a_{Mess,1} \\ b_{DUT,1} \end{bmatrix}$$

whereby, with the scatter parameters of the scatter matrix $S_{c,K,f}$, terms $e_{22}$, $e_{23} \cdot e_{32}$ and $e_{33}$ of an error matrix $$E_B = \begin{bmatrix} e_{22} & e_{23} \\ e_{32} & e_{33} \end{bmatrix}$$

are determined for a signal transmission between the fifth and sixth test port on the one hand and the second port in the calibration plane on the other hand depending on a frequency f of the waves $a_1$ or $a_2$ by means of a predetermined calibration algorithm, whereby $E_B$ is a scatter matrix according to $$\begin{bmatrix} a_{DUT,2} \\ b_{Mess,2} \end{bmatrix} = E_B \begin{bmatrix} b_{DUT,2} \\ a_{Mess,2} \end{bmatrix}$$

whereby the isolated terms $i_{01}$ and $i_{10}$ from the product $i_{01} \cdot i_{10}$ as well as the isolated terms $i_{23}$ and $i_{32}$ from the product $i_{23} \cdot i_{32}$ are determined according to the formulas $$i_{01} = i_{10} = \pm\sqrt{i_{01}i_{10}}$$

And $$i_{23} = i_{32} = \pm\sqrt{i_{23}i_{32}}$$

whereby the sign is in each case determined starting out from a frequency point with known phase through continuous extrapolation, whereby a phase difference from one frequency point to a next frequency point is reduced by 180° if this phase difference exceeds a predetermined threshold value;

whereby the isolated term $e_{10}$ is calculated from the product $e_{10} \cdot e_{01}$ according to the formula $$e_{10} = i_{10} \cdot \frac{a_1}{a_{Mess,1}} \cdot \frac{1 - e_{11}S_{11,DUT,K^*}}{1 - i_{11}S_{11,DUT,K^*}}$$

and the isolated term $e_{01}$ is determined from this, whereby $$S_{11,DUT,K^*} = \frac{(S_{11,K^*,f} - i_{00})}{(i_{10} \cdot i_{01} + i_{11} \cdot (S_{11,K^*,f} - i_{00}))}$$

and K* designates a calibration standard without transmission;

whereby the isolated term $e_{23}$ from the product $e_{32} \cdot e_{23}$ is calculated according to the formula $$e_{23} = i_{23} \cdot \frac{a_2}{a_{Mess,2}} \cdot \frac{1 - e_{22}S_{22,DUT,K^*}}{1 - i_{22}S_{22,DUT,K^*}}$$

and the isolated term $e_{23}$ is determined from this, whereby $$S_{22,DUT,K^*} = \frac{(S_{22,K^*,f} - i_{22,f})}{(i_{32} \cdot i_{23} + i_{33} \cdot (S_{22,K^*,f} - i_{22,f}))}$$

and K* designates a calibration standard without transmission.

This has the advantage that all individual elements of the error matrices $E_A$ and $E_B$ are known, so that the absolute wave quantities $a_{DUT,1}$, $a_{DUT,2}$, $b_{DUT,1}$ $b_{DUT,2}$ in the calibration plane can be determined from the values $a_{Mess,1}$, $a_{Mess,2}$, $b_{Mess,1}$, and $b_{Mess,2}$ measured on the directional couplers. At the same time the quality or directivity of the directional couplers has no influence on the measuring result, since this is taken into account through the calibration by means of correction of the matrix $S_{unkorr,K,f}$. However, the directivity must be greater than zero.

A use of a VNA with only four test ports is made possible in that, through switching, the third and fourth test ports of the VNA can in addition be used as fifth and sixth test ports, so that the waves $a_{Mess,1}$ and $b_{Mess,1}$ are measured at the third and fourth test ports of the VNA at a different time from the waves $a_{Mess,2}$ and $b_{Mess,2}$ at the fifth and sixth test ports of the VNA.

In order to use a 7-term model for the calibration of a two-port, the terms $e_{00}$, $e_{01} \cdot e_{10}$ and $e_{11}$ of the error matrix $E_A$ as well as the terms $e_{22}$, $e_{23} \cdot e_{32}$ and $e_{33}$ of the error matrix $E_B$ are determined by means of a TRL algorithm from the corrected scatter matrix $S_{c,K,f}$ and the terms $i_{00}$, $i_{01} \cdot i_{10}$ and $i_{11}$ of the error matrix $I_A$ as well as the terms $i_{22}$, $i_{23} \cdot i_{32}$ and $i_{33}$ of the error matrix $I_B$ are determined by means of a TRL algorithm from the scatter matrix $S_{I,K,f}$.

A TRL algorithm producing particularly numerically stable and reliable measuring results is achieved in that three different calibration standards of the following type are used for the TRL algorithm: a first calibration standard of the type "thru" (through-connection), a second calibration standard of the type "reflect" (unmatched termination) and a third calibration standard of the type "line" (delay line), whereby the reflection coefficient of the calibration standard "reflect" is unequal to zero, whereby a phase of the reflection at the calibration standard "reflect" is precisely determined in advance to +/−90°, whereby the identical calibration standard "reflect" is used for all test ports of the VNA, whereby a line impedance of the calibration standard "thru" substantially corresponds to a line impedance of the calibration standard "line", whereby the electrical length of the calibration standard "thru" is by definition 0, whereby an electrical length of the calibration standard "line" is unequal to $$n \cdot \frac{\lambda}{2},$$

where $\lambda$=wavelength and n is a whole number greater than or equal to 1, where K="reflect", "line" or "thru" and K*="reflect".

An improvement in the numerical stability of the method is achieved in that, for a difference $\Delta\varphi$ in the electrical length of the calibration standard "line" in relation to the electrical length of the calibration standard "thru", $$(n-1)\frac{\lambda}{2} + \delta < \Delta\varphi < n \cdot \frac{\lambda}{2} - \delta$$

where $\delta \geq 20°$.

A particularly readily implementable calculation method is obtained in that the TRL algorithm determines the output values $E_A$ and $E_B$ or $I_A$ and $I_B$ from the input values $S_{c,K,f}$ or $S_{I,K,f}$ as follows:

the terms of the matrices $E_A$, $E_B$ or $I_A$ and $I_B$ are determined through the terms of their respective transmission matrices $T_A$ and $T_B$ with $$T_A = \begin{bmatrix} r_{11} & r_{12} \\ r_{21} & r_{22} \end{bmatrix} = r_{22} \begin{bmatrix} a & b \\ c & 1 \end{bmatrix}$$

And $$T_B = \begin{bmatrix} \rho_{11} & \rho_{12} \\ \rho_{21} & \rho_{22} \end{bmatrix} = \rho_{22} \begin{bmatrix} \alpha & \beta \\ \gamma & 1 \end{bmatrix}$$

where $$\begin{bmatrix} b_{DUT,1} \\ a_{DUT,1} \end{bmatrix} = T_A^{-1} \begin{bmatrix} b_{MESS,1} \\ a_{MESS,1} \end{bmatrix}$$

$$\begin{bmatrix} a_{DUT,2} \\ b_{DUT,2} \end{bmatrix} = T_B \begin{bmatrix} a_{MESS,2} \\ b_{MESS,2} \end{bmatrix}$$

applies for $T_A$=transmission matrix of $E_A$ and $T_B$=transmission matrix of $E_B$ and where $$\begin{bmatrix} b_{DUT,1} \\ a_{DUT,1} \end{bmatrix} = T_A^{-1} \begin{bmatrix} b_1 \\ a_1 \end{bmatrix}$$

$$\begin{bmatrix} a_{DUT,2} \\ b_{DUT,2} \end{bmatrix} = T_B \begin{bmatrix} a_2 \\ b_2 \end{bmatrix}$$

applies for $T_A$=transmission matrix of $I_A$ and $T_B$=transmission matrix of $I_B$ and where, for a desired system-error-free transmission matrix of the DUT in the calibration plane $T_{DUT}$, $$T_{DUT} = \frac{1}{r_{22}\rho_{22}} \frac{1}{a\alpha} \frac{1}{1 - b\frac{c}{a}} \frac{1}{1 - \gamma\frac{\beta}{\alpha}} \begin{bmatrix} 1 & -b \\ -c & a \end{bmatrix} T_M \begin{bmatrix} 1 & -\beta \\ -\gamma & \alpha \end{bmatrix}$$

where $T_M$ is a transmission matrix which is determined from a scatter matrix measured at the test ports of the VNA;

whereby, in order to determine the seven values $a, b, c, \alpha, \beta, \gamma, r_{22}\rho_{22}$, a transmission matrix $T_T$ for the calibration standard "thru" and a transmission matrix $T_D$ for the calibration standard "line" is determined from scatter matrices for these calibration standards, in each case measured at the test ports of the VNA, where $$T_T = T_A T_B = g \begin{bmatrix} d & e \\ f & 1 \end{bmatrix}$$

$$T_D = T_A T_L T_B$$

$$T_D T_T^{-1} = T_{DT} = \begin{bmatrix} t_{11} & t_{12} \\ t_{21} & t_{22} \end{bmatrix}$$

$$T_D T_T^{-1} = T_{DT} = \begin{bmatrix} t_{11} & t_{12} \\ t_{21} & t_{22} \end{bmatrix}$$

where $T_L$ is a transmission matrix of the calibration standard "line" in the calibration plane and is defined as $$T_L = T_{DUT,D} = \begin{bmatrix} e^{-\overline{\gamma}l} & 0 \\ 0 & e^{+\overline{\gamma}l} \end{bmatrix}$$

where l is the actual physical length of the line and $\overline{\gamma}$ the propagation constant where $\overline{\gamma} = \overline{\alpha} + j\overline{\beta}$, where $\overline{\alpha}$ is a damping constant and $\overline{\beta}$ is a phase constant;

whereby in order to determine b the lesser solution in terms of amount, and in order to determine a/c the greater solution in terms of amount to the quadratic equation $$t_{21}x^2 + (t_{22} - t_{11})x - T_{12} = 0$$

is calculated;
whereby in order to determine $r_{22}\rho_{22}$ the equation $$r_{22}\rho_{22} = g \frac{1 - e\frac{c}{a}}{1 - b\frac{c}{a}}$$

is calculated;
whereby in order to determine $\gamma$, $\beta/\alpha$ and $a\alpha$, the equations $$\gamma = \frac{f - \frac{c}{a}d}{1 - \frac{c}{a}e}$$

$$a\alpha = \frac{d - bf}{1 - \frac{c}{a}e}$$

are calculated;
whereby in order to determine a the values $b_{Mess,1,reflect,f}$ and $a_{Mess,1,reflect,f}$ as well as $b_{Mess,2,reflect,f}$ and $a_{Mess,2,reflect,f}$ for the transmission-free calibration standard "reflect" with a reflection coefficient $\Gamma_R$, the sign of which is known, are measured through the error two-ports with the error matrices $E_A$ and $E_B$, and the values $w_1$ and $w_2$ are calculated according to $$w_1 = \frac{b_{mess,1,reflect,f}}{a_{Mess,1,reflect,f}} = \frac{a\Gamma_R + b}{c\Gamma_R + 1}$$

$$w_2 = \frac{b_{mess,2,reflect,f}}{a_{Mess,2,reflect,f}} = \frac{\alpha\Gamma_R - \gamma}{\beta\Gamma_R - 1}$$

whereby the amount of a is calculated according to $$a = \pm \sqrt{\frac{w_1 - b}{w_2 + \gamma} \frac{1 + w_2 \frac{\beta}{\alpha}}{1 - w_1 \frac{c}{a}} \frac{d - bf}{1 - \frac{c}{a}e}}$$

whereby the sign of a is determined through insertion of the two possible results for a in the equation $$\Gamma_R = \frac{w_1 - b}{a\left(1 - w_1 \frac{c}{a}\right)}$$

in that the respective sign is compared with the known sign for $\Gamma_R$ and, if these correspond, this sign is determined for a,
where c is determined from the known value for a and a/c is determined,
whereby in order to determine $\alpha$ and $\beta$ the equations $$\alpha = \frac{1}{a} \frac{d - bf}{1 - \frac{c}{a}e}$$

$$\beta = \alpha \frac{e - b}{d - bf}$$

are calculated;
whereby the terms of the transmission matrices $T_A$ and $T_B$ are determined from the values $a,b,c,\alpha,\beta,\gamma,r_{22}\rho_{22}$, whereby the terms of the associated scatter matrices $E_A$ and $E_B$ or $I_A$ and $I_B$ are calculated from the terms of the transmission matrices $T_A$ and $T_B$ by means of the conversion relationship between scatter matrix and transmission matrix. The reflection coefficient is hereby $\Gamma_R = S_{11,DUT}$ for the reflection measurement through the error two-port with the error matrix $E_A$, and $\Gamma_R = S_{22,DUT}$ for the reflection measurement through the error two-port with the error matrix $E_B$, where $S_{11,DUT}$ and $S_{22,DUT}$ are terms of the scatter matrix SDUT $$S_{DUT} = \begin{bmatrix} S_{11,DUT} & S_{12,DUT} \\ S_{21,DUT} & S_{22,DUT} \end{bmatrix}$$

of the DUT in the calibration plane. Since only $r_{22}^* \rho_{22}$ is known, only $e_{01}^* e_{10}$ or $e_{23}^* e_{32}$ can also be calculated. This follows from the conversion relationship from T- to S-matrices.

One method by means of which the error terms of a one-port measurement can be calculated is the so-called OSM method. The standards Open, Short and Match are thereby used. However, the requirement that these, or the reflection coefficients $\Gamma_O$, $\Gamma_M$, $\Gamma_S$ generated by them, must be precisely known in the OSM method leads to high complexity and costs for the calibration standards.

The system, consisting of the error two-port 11 with an error matrix E and a termination with the reflection coefficient $\Gamma_{DUT}$ is illustrated in FIG. 1. At a test port 10 of the VNA, a wave with the wave quantity $\alpha_0$ 12 runs out and a wave with the wave quantity $\beta_0$ 14 runs in. Located in a calibration plane 16 is a port 18 of the DUT or termination 20 with the reflection coefficient $\Gamma_{DUT}$. At the port 18 of the DUT or in the calibration plane 16, a wave with the wave quantity $\alpha_1$ 22 runs in and a wave with the wave quantity $\beta_1$ 24 runs out. The error matrix E of the error two-port 26 contains the terms $\epsilon_{00}$ 28 (reflection at the test port 10), $\epsilon_{10}$ 30 (transmission from the test port 10 to the port 18 in the calibration plane 16), $\epsilon_{01}$ 32 (transmission from the port 18 in the calibration plane 16 to the test port 10) and $\epsilon_{11}$ 34 (reflection at the port 18 in the calibration plane 16).

The error two-port 11 which is to be determined can be described through the scatter matrix or error matrix E $$E = \begin{bmatrix} \varepsilon_{00} & \varepsilon_{10} \\ \varepsilon_{01} & \varepsilon_{11} \end{bmatrix} \quad (1)$$

The reflection coefficient $\Gamma_{DUT}$ assumes the value $\Gamma_O$, $\Gamma_M$, $\Gamma_S$ during the calibration depending on the connected standard. In the ideal case of a perfect matching of the match standard, $\Gamma_M = 0$ can be assumed. The measured wave quantities $\alpha_0$ 12 and $\beta_0$ 14 describe the wave running from the port 10 of the VNA to the error two-port 11 or the wave reflected back from the error two-port 11 to the port 10 of the VNA. The wave quantities $\alpha_1$ 22 and $\beta_1$ 24 describe the wave quantities to be determined in the calibration plane 16, i.e., the wave running from the error two-port 11 into the termination 20 or the wave running from the termination 20 to the error two-port 11. The measuring results obtained with the individual calibration standards K are described by $$M_K = \frac{\beta_{0,K}}{\alpha_{0,K}} \quad (2)$$

where K stands for the calibration standard used (O, S or M). For $M_O$, $M_S$ and $M_M$, the following equations can be set up, as illustrated with reference to FIG. 1.

$$M_O = e_{00} + \frac{e_{10}e_{01}\Gamma_O}{1 - e_{11}\Gamma_O} \quad (3)$$

$$M_S = e_{00} + \frac{e_{10}e_{01}\Gamma_S}{1 - e_{11}\Gamma_S} \quad (4)$$

$$M_M = e_{00} \quad (5)$$

Equation (5) takes this very simple form due to the assumption $\Gamma_M = 0$ made above. Following conversion of (3) to (5) the values $e_{00}$, $e_{11}$ and $e_{10}e_{01}$ can be determined.

$$e_{00} = M_M \quad (6)$$

$$e_{10}e_{01} = \frac{(\Gamma_O - \Gamma_S)(M_O - M_M)(M_S - M_M)}{\Gamma_O \Gamma_S (M_O - M_S)} \quad (7)$$

$$e_{11} = \frac{\Gamma_S(M_O - M_M) - \Gamma_O(M_S - M_M)}{\Gamma_O \Gamma_S (M_O - M_S)} \quad (8)$$

Since the product $e_{10}e_{01}$ cannot readily be decomposed into its factors, although the system-error-corrected measured value $\Gamma_{DUT}$ can be determined from the error terms, the wave quantities $\alpha_1$ 22 and $\beta_1$ 24 of which this consists cannot.

This is done with the measured value $$M_{DUT} = \frac{\beta_{0,DUT}}{\alpha_{0,DUT}}$$

by means of equation (9) (HIEBEL, Michael: "Basic Principles of Vectorial Network Analysis", 1st edition, Rohde & Schwarz GmbH & Co. KG, 2006).

$$\Gamma_{DUT} = \frac{\beta_1}{\alpha_1} = \frac{M_{DUT} - e_{00}}{e_{10}e_{01} + e_{11}(M_{DUT} - e_{00})} \quad (9)$$

In equation (9) it becomes clear that in order to isolate the quotient $$\frac{\beta_1}{\alpha_1}$$

the product $e_{10}e_{01}$ must first be decomposed.

If the device under test is, as in the present case, a two-port, then instead of the previously explained 3-term-model a 7-term-model, for example the TRL method, must be used for the calibration. Methods such as TRL calibration lead to the values necessary for this purpose. The name of this method is derived from the three calibration standards thru (through-connection), reflect (unmatched termination) and line (delay line). The reflection coefficient of the Reflect standard need not be known, but must differ from zero. A one-port standard is used for this purpose, for the transmission of which $S_{21} = S_{12} = 0$ thus applies (EUL, H.-J.; SCHIEK, B.: "A generalized theory and new calibration procedures for network analyzer self-calibration", In: Microwave Theory and Techniques, IEEE transactions on 39 (1991), April, No. 4, p. 724-731, http://dx.doi.org/10.1109/22.76439-DOI 10.1109/22.76439-ISSN 0018-9480). The phase of the reflection must be precisely known to ±90° and the same Reflect standard must be used for both test ports 1 and 2 of the VNA (Vectorial Network Analyzer). The length of the through-connection is assumed to be l=0. Its line impedance should correspond to that of the delay line. Beyond this, it is not necessary to know the exact length of the delay line. Its electrical length φ must simply be unequal to $$n \cdot \frac{\lambda}{2}$$

(λ wavelength). Usually, this condition is further extended by a distance δ:

$$(n-1)\frac{\lambda}{2} + \delta < \Delta\varphi < n \cdot \frac{\lambda}{2} - \delta \quad (10)$$

where δ≥20° (ENGEN, G. F.; HOER, C. A.: Thru-Reflect-Line: An Improved Technique for Calibrating the Dual Six-Port Automatic Network Analyzer. In: Microwave Theory and Techniques, IEEE transactions on 27 (1979), December, No. 12, p. 987-993, http://dx.doi.org/10.1109/TMTT.1979.1129778-DOI 10.1109/TMTT.1979.1129778-ISSN 001 8-9480).

The condition in equation (10) applies to the difference in electrical length between through-connection and delay line. However, since the former was assumed to have a length of l=0, this difference equals the electrical length of the Line standard itself.

Figure 2:
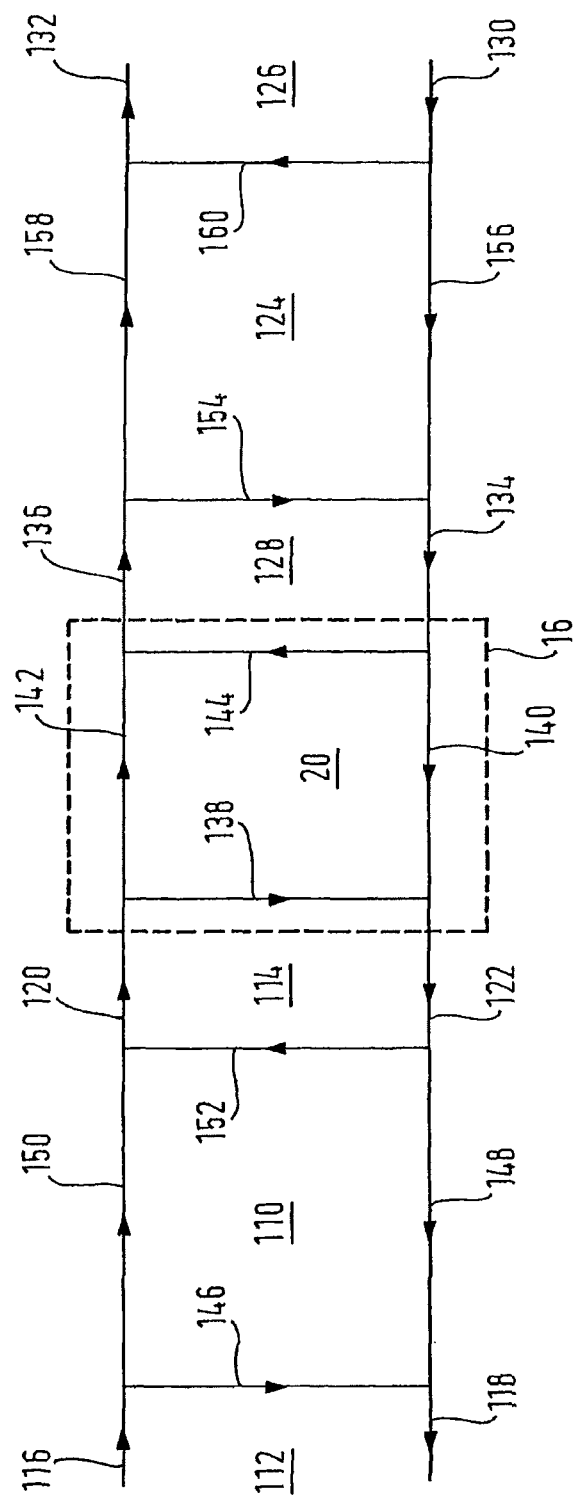
FIG. 2 shows a schematic signal flow diagram for two error two-ports for the measurement of a DUT with two ports in a calibration plane.

Unlike the measurement of one-ports, in this case two error two-ports are to be determined. These two-ports are in each case located between one of the test ports of the VNA and a port of the device under test in the calibration plane, as shown in FIG. 2. A first error two-port 110 with an error matrix $X_A$ comprises a port A 112 of the VNA and a first port 114 of the DUT 20 in the calibration plane 16. The electromagnetic waves running in and out at the first error two-port 110 have the wave quantities $a_I$ 116, $b_I$ 118, $a_{DUT,1}$ 120, and $b_{DUT,1}$ 122, whereby $a_I$ 116 describes the wave running out at the port A 112 of the VNA, $b_I$ 118 describes the wave running in at the port A 112 of the VNA, $a_{DUT,1}$ 120 describes the wave running in at the first port 114 of the DUT 20 in the calibration plane 16 and $b_{DUT,1}$ 122 describes the wave running out at the first port 114 of the DUT 20 in the calibration plane 16.

A second error two-port 124 with an error matrix $X_B$ comprises a port B 126 of the VNA and a second port 128 of the DUT 20 in the calibration plane 16. The electromagnetic waves running in and out at the second error two-port 124 have the wave quantities $a_{II}$ 130, $b_{II}$ 132, $a_{DUT,2}$ 134, and $b_{DUT,2}$ 136, whereby $a_{II}$ 130 describes the wave running out at the port B 126 of the VNA, $b_{II}$ 132 describes the wave running in at the port B 126 of the VNA, $a_{DUT,2}$ 134 describes the wave running in at the second port 128 of the DUT 20 in the calibration plane 16 and $b_{DUT,2}$ 136 describes the wave running out at the second port 128 of the DUT 20 in the calibration plane 16.

$S_{DUT}$ with the matrix terms $S_{11,DUT}$ 138, $S_{12,DUT}$ 140, $S_{21,DUT}$ 142 and $S_{22,DUT}$ 144 hereby describes the scatter matrix of the device under test (DUT) 20 in the calibration plane 16.

$$S_{DUT} = \begin{bmatrix} S_{11,DUT} & S_{12,DUT} \\ S_{21,DUT} & S_{22,DUT} \end{bmatrix} \quad (11)$$

$$\begin{pmatrix} b_{DUT,1} \\ b_{DUT,2} \end{pmatrix} = S_{DUT} \begin{pmatrix} a_{DUT,1} \\ a_{DUT,2} \end{pmatrix} \quad (12)$$

The error matrix $X_A$ comprises the matrix terms $x_{00}$ 146, $x_{01}$ 148, $x_{10}$ 150 and $x_{11}$ 152.

$$X_A = \begin{bmatrix} x_{00} & x_{01} \\ x_{10} & x_{11} \end{bmatrix} \quad (13)$$

$$\begin{pmatrix} b_1 \\ a_{DUT,1} \end{pmatrix} = X_A \begin{pmatrix} a_1 \\ b_{DUT,1} \end{pmatrix} \quad (14)$$

The error matrix $X_B$ comprises the matrix terms $x_{22}$ 154, $x_{23}$ 156, $x_{32}$ 158 and $x_{33}$ 160.

$$X_B = \begin{bmatrix} x_{22} & x_{23} \\ x_{32} & x_{33} \end{bmatrix} \quad (15)$$

$$\begin{pmatrix} a_{DUT,2} \\ b_{II} \end{pmatrix} = X_B \begin{pmatrix} b_{DUT,2} \\ a_{II} \end{pmatrix} \quad (16)$$

It will be explained in the following how the matrix terms of the error matrices $X_A$ and $X_B$ are determined from measurements with calibration standards by means of a TRL method or a TRL algorithm. This explanation is oriented on ENGEN, G. F.; HOER, C. A.: "Thru-Reflect-Line: An Improved Technique for Calibrating the Dual Six-Port Automatic Network Analyzer", IEEE transactions Microwave Theory and Techniques, Vol. MTT-27, No. 12, December 1979.

If one describes the individual blocks $X_A$, $X_B$ and $S_{DUT}$ through their corresponding transmission matrices $T_A$, $T_B$ and $T_{DUT}$, then the measured relationships between the wave quantities $a_I$ 116, $b_I$ 118, $a_{II}$ 130, $b_{II}$ 132 can be described through the measuring matrix $T_M$ with $$\begin{pmatrix} a_I \\ b_I \end{pmatrix} = T_M \begin{pmatrix} a_{II} \\ b_{II} \end{pmatrix} \quad (17)$$

$$T_M = T_A T_{DUT} T_B \quad (18)$$

The desired transmission matrix of the device under test (DUT) can be expressed following conversion through $$T_{DUT} = T_A^{-1} T_M T_B^{-1} \quad (19)$$

If one writes $T_A$ as $$T_A = \begin{bmatrix} r_{11} & r_{12} \\ r_{21} & r_{22} \end{bmatrix} = r_{22} \begin{bmatrix} a & b \\ c & 1 \end{bmatrix} \quad (20)$$

and $T_B$ as $$T_B = \begin{bmatrix} \rho_{11} & \rho_{12} \\ \rho_{21} & \rho_{22} \end{bmatrix} = \rho_{22} \begin{bmatrix} \alpha & \beta \\ \gamma & 1 \end{bmatrix} \quad (21)$$

then their inverses result as $$T_A^{-1} = \frac{1}{r_{22}} \frac{1}{a - bc} \begin{bmatrix} 1 & -b \\ -c & a \end{bmatrix} \quad (22)$$

$$T_B^{-1} = \frac{1}{\rho_{22}} \frac{1}{\alpha - \beta\gamma} \begin{bmatrix} 1 & -\beta \\ -\gamma & \alpha \end{bmatrix} \quad (23)$$

If one now inserts (22) and (23) in (19), then with $$T_{DUT} = \frac{1}{r_{22}\rho_{22}} \frac{1}{a\alpha} \frac{1}{1 - b\frac{c}{a}} \frac{1}{1 - \gamma\frac{\beta}{\alpha}} \begin{bmatrix} 1 & -b \\ -c & a \end{bmatrix} T_M \begin{bmatrix} 1 & -\beta \\ -\gamma & \alpha \end{bmatrix} \quad (24)$$

one obtains the desired transmission matrix of the DUT, free of system errors (ENGEN, G. F.; HOER, C. A.: "Thru-Reflect-Line: An Improved Technique for Calibrating the Dual Six-Port Automatic Network Analyzer", IEEE Transactions Microwave Theory and Techniques, Vol. MTT-27, No. 12, December 1979). If the seven values a, b, c, $\alpha$, $\beta$, $\gamma$ and $r_{22}\rho_{22}$ are known from (24), then the matrix elements of the error matrices $X_A$ and $X_B$ of the two error two-ports can first be determined except for the product $x_{01} x_{10}$ or $x_{32} x_{23}$ and from these ultimately also the matrix $T_{DUT}$.

In order to obtain these seven elements, the measured transmission matrix $T_M = T_T$ of the measurement with the calibration standard "thru"

$$T_T = T_A T_B = g \begin{bmatrix} d & e \\ f & 1 \end{bmatrix} \quad (25)$$

as well as the measured transmission matrix $T_M = T_D$ of the measurement with the calibration standard "line"

$$T_D = T_A T_L T_B \quad (26)$$

where $T_L$ is the transmission matrix $T_{DUT,D}$ of the calibration standard "line" in the calibration plane, are first defined with $$T_{DUT,D} = T_L = \begin{bmatrix} e^{-\overline{\gamma}l} & 0 \\ 0 & e^{+\overline{\gamma}l} \end{bmatrix}. \quad (27)$$

where l is the actual physical length of the line and $\overline{\gamma}$ the propagation constant, where $\overline{\gamma} = \overline{\alpha} + j\overline{\beta}$, where $\overline{\alpha}$ is a damping constant and $\overline{\beta}$ a phase constant. The transmission matrix $T_T$ hereby represents the matrix measured with use of the calibration standard "thru", since the through-connection is assumed to have a length l=0. This does not apply for the calibration standard "line", for which reason $T_L$ stands for its true matrix in the calibration plane and $T_D$ for the transmission matrix measured with this calibration standard "line" at the test port A 112 of the VNA and test port B 126 of the VNA. If one converts (25) to $$T_B = T_A^{-1} T_T \tag{28}$$

and inserts (28) in (26), then one obtains $$T_D = T_A T_L T_A^{-1} T_T \tag{29}$$

This can be converted to $$T_D T_T^{-1} T_A = T_A T_L \tag{30}$$

If one defines the matrix $$T_{DT} = T_D T_T^{-1} = \begin{bmatrix} t_{11} & t_{12} \\ t_{21} & t_{22} \end{bmatrix} \tag{31}$$

which can be determined through measurement with the calibration standards "thru" and "line" and inserts (31) in (30), one obtains $$T_{DT} T_A = T_A T_L \tag{32}$$

With the definition of $T_A$ from (20), (32) can be written as follows:

$$\begin{bmatrix} t_{11} & t_{12} \\ t_{21} & t_{22} \end{bmatrix} \begin{bmatrix} a & b \\ c & 1 \end{bmatrix} = \begin{bmatrix} a & b \\ c & 1 \end{bmatrix} \begin{bmatrix} e^{-\gamma l} & 0 \\ 0 & e^{+\gamma l} \end{bmatrix} \tag{33}$$

The four equations which are contained in this system are, written out:

$$t_{11} a + t_{12} c = a e^{-\gamma l} \tag{34}$$

$$t_{21} a + t_{22} c = c e^{-\gamma l} \tag{35}$$

$$t_{11} b + t_{12} = b e^{+\gamma l} \tag{36}$$

$$t_{21} b + t_{22} = e^{+\gamma l} \tag{37}$$

(34) can now be divided by (35), producing a quadratic equation for a/c:

$$t_{21} \left(\frac{a}{c}\right)^2 + (t_{22} - t_{11})\left(\frac{a}{c}\right) - t_{12} = 0 \tag{38}$$

Analogously, on dividing (36) by (37) one obtains $$t_{21} b^2 + (t_{22} - t_{11}) b - t_{12} = 0 \tag{39}$$

Consequently, a/c and b are the two solutions to the same quadratic equation. The difficulty in solving the quadratic equation from (38) and (39) consists in arriving at a correct allocation of the solutions a/c and b. It can first be shown through the quotients from (37) and (35)

$$e^{2\gamma l} = \frac{t_{21} b + t_{22}}{t_{21} \frac{a}{c} + t_{22}} \tag{40}$$

that the two terms a/c and b are never identical, since the term $e^{2\gamma l}$ always remains unequal to 1, which is guaranteed through the condition in (10). If one considers that $b = x_{00}$ and $$\frac{a}{c} = x_{00} - \frac{x_{01} x_{10}}{x_{11}} \tag{41}$$

which follows from the definition of the transformation of scatter to transmission matrix, and that in realistic cases one can assume $|x_{00}|, |x_{11}| \ll 1$, then it follows that $$|b| \ll \left|\frac{a}{c}\right| \tag{42}$$

which makes it possible to allocate the solutions to the quadratic equation.

With an equation system with four equations, a maximum of four unknowns can be determined. The determinant of (32) is formed:

$$\det(T_{DT}) \det(T_A) = \det(T_A) \det(T_L) \tag{43}$$

The expression $\det(T_A)$ can be shortened on both sides of the equations. Since, for $\det(T_L)$, $$\det(T_L) = e^{-\gamma l} \cdot e^{+\gamma l} - 0 \cdot 0 = 1 \tag{44}$$

following insertion in (43) this leads to $$t_{11} t_{22} - t_{12} t_{21} = 1 \tag{45}$$

This equation shows that of the four measured values $t_{xy}$ only three can be independent of one another in order to fulfil the equation. Thus, only three independent values (b, a/c and $e^{2\gamma l}$) also exist, since of the equations (34) to (37) only three equations are independent of one another. These values have already been determined.

In order to determine the further necessary unknown, (25) is now examined more closely. This can be written as $$g \begin{bmatrix} d & e \\ f & 1 \end{bmatrix} = r_{22} \rho_{22} \begin{bmatrix} a & b \\ c & 1 \end{bmatrix} \begin{bmatrix} \alpha & \beta \\ \gamma & 1 \end{bmatrix} \tag{46}$$

If the inverse $$\begin{bmatrix} a & b \\ c & 1 \end{bmatrix}^{-1} = \frac{1}{a - bc} \begin{bmatrix} 1 & -b \\ -c & a \end{bmatrix} \tag{47}$$

is multiplied from the left in (46), this produces $$r_{22} \rho_{22} \begin{bmatrix} \alpha & \beta \\ \gamma & 1 \end{bmatrix} = \frac{g}{a - bc} \begin{bmatrix} 1 & -b \\ -c & a \end{bmatrix} \begin{bmatrix} d & e \\ f & 1 \end{bmatrix} \tag{48}$$

which can be further rearranged into $$r_{22} \rho_{22} \begin{bmatrix} \alpha & \beta \\ \gamma & 1 \end{bmatrix} = \frac{g}{a - bc} \begin{bmatrix} d - gf & e - b \\ af - cd & a - ce \end{bmatrix} \tag{49}$$

from which $$r_{22} \rho_{22} = g \frac{a - ce}{a - bc} = g \frac{1 - e\frac{c}{a}}{1 - b\frac{c}{a}} \tag{50}$$

and $$\begin{bmatrix} \alpha & \beta \\ \gamma & 1 \end{bmatrix} = \frac{1}{a - ce} \begin{bmatrix} d - bf & e - b \\ af - cd & a - ce \end{bmatrix} \tag{51}$$

can in turn be extracted. $r_{22}\rho_{22}$ is another of the seven values sought. Three further values can be determined through (51)

$$\gamma = \frac{f - \frac{c}{a}d}{1 - \frac{c}{a}e} \tag{52}$$

$$\frac{\beta}{\alpha} = \frac{e - b}{d - bf} \tag{53}$$

$$\alpha a = \frac{d - bf}{1 - \frac{c}{a}e} \tag{54}$$

Further steps are necessary in order to be able to determine the isolated value a. At this point, the results of the measurement with the calibration standard "reflect" are now used. Two measured values $w_1$, and $w_2$ are defined which describe the measurements of the transmission-free calibration standard "reflect" with its reflection coefficient $\Gamma_R$ through the error two-ports $E_A$ and $E_B$. These are provided through the wave quantities $a_I$ 116, $b_I$ 118, $a_{II}$ 130, $b_{II}$ 132 at the test ports A 112 and B 126 of the VNA for the case of measurement with the calibration standard "reflect".

$$w_1 = \frac{b_I}{a_I} = \frac{a\Gamma_R + b}{c\Gamma_R + 1} \tag{55}$$

$$w_2 = \frac{b_{II}}{a_{II}} = \frac{a\Gamma_R - \gamma}{\beta\Gamma_R - 1} \tag{56}$$

For the sake of simplicity, the expression $\Gamma_R$ is used here. It corresponds to $S_{11,DUT}$ for the reflection measurement through the error two-port 110 with the error matrix $X_A$, or $S_{22,DUT}$ in the case of measurement through the error two-port 124 with the error matrix $X_B$, since, as mentioned above, these two reflections must by definition be identical.

Since the values b, a/c, $\gamma$ and $\beta/\alpha$ are known, these equations can be converted to $$a = \frac{w_1 - b}{\Gamma_R\left(1 - w_1\frac{c}{a}\right)} \tag{57}$$

$$\alpha = \frac{w_2 + \gamma}{\Gamma_R\left(1 + w_2\frac{\beta}{\alpha}\right)} \tag{58}$$

(57) is now divided by (58), producing $$\frac{a}{\alpha} = \frac{w_1 - b}{w_2 + \gamma} \frac{1 + w_2\frac{\beta}{\alpha}}{1 - w_1\frac{c}{a}} \tag{59}$$

This result is multiplied by (54), which leads to the equation $$a^2 = \frac{w_1 - b}{w_2 + \gamma} \frac{1 + w_2\frac{\beta}{\alpha}}{1 - w_1\frac{c}{a}} \frac{d - bf}{1 - \frac{c}{a}e} \tag{60}$$

Finally, if one extracts the square root from this, an expression for $\alpha$ is found.

$$a = \pm \sqrt{\frac{w_1 - b}{w_2 + \gamma} \frac{1 + w_2\frac{\beta}{\alpha}}{1 - w_1\frac{c}{a}} \frac{d - bf}{1 - \frac{c}{a}e}} \tag{61}$$

If the sign of the reflection coefficient of the calibration standard "reflect" is known, which was assumed at the beginning, then the sign of $\alpha$ can also be determined through the expression $$\Gamma_R = \frac{w_1 - b}{a\left(1 - w_1\frac{c}{a}\right)} \tag{62}$$

and the calibration is completed; in this way all seven values from (24) can be determined. Since the pre-exponential factors $r_{22}$ and $\rho_{22}$ of the matrices $T_A$ and $T_B$ in these calculations can only be determined as a product (see (50)), an uncertainty remains regarding their isolation. This does not represent any problem for the classic TRL calibration, since in this case only relative values (scatter parameters) are to be determined. In this case the product $r_{22}\rho_{22}$ can be divided in any way, since in (24) only the product of both values is relevant for the determination of $T_{DUT}$. If one wishes to determine the scatter matrix, then one finds that the pre-exponential factor of a transmission matrix is automatically eliminated on its corresponding transformation (SCHIEK, Burkhard, "Basic Principles of High Frequency Measuring Technology", 1st ed., Springer-Verlag, 1999). If one considers the error matrices then, due to the aforementioned uncertainty, ultimately only the six values $x_{00}$, $x_{01} \cdot x_{10}$, $x_{11}$, $x_{22}$, $x_{23} \cdot x_{32}$ and $x_{33}$ can be determined. In order to separate the two products $x_{01} \cdot x_{10}$ and $x_{23} \cdot x_{32}$ and thus also be able to calculate absolute values such as current and voltage in the calibration plane, the method must be expanded. Such an expansion, according to the invention, of the TRL method, which is essential for the measurement of non-linear components, is described in more detail in the following.

In order to measure electrical values, measuring methods in both the time domain and in the frequency domain are available. One advantage of measurement in the time domain is the simultaneous recording of all spectral components. The phase information of all spectral components is thus retained, which also facilitates the measurement of multi-frequency, non-periodic signals. However, the dynamic range of measurement is hereby limited by the oscilloscopes used. In this respect measurements in the frequency domain are superior to time domain measurements due to the great dynamic range of, for example, network analyzers.

Both in the case of measurement in the time domain as well as in the frequency domain, a calibration is necessary in order to calculate system errors which occur and correct the measuring results to take these into account. With the TRL calibration method described above, only the products $x_{01}x_{10}$ or $x_{32}x_{23}$ can be correctly calculated from the matrices in (13) and (15). This TRL calibration method is therefore only suitable for the determination of relative values (scatter parameters).

However, in order to be able to determine not ratios but absolute values (propagated and reflected wave or current and voltage), which is necessary for the modelling of non-linear components, the previously explained TRL calibration method is expanded according to the invention. The aforementioned products are decomposed into their individual factors. A method according to the invention on the basis of which all individual elements of the error two-ports $E_A$ and $E_B$ can be determined is presented in the following. How this is used, finally, to calculate the absolute wave quantities, as well as current and voltage, in the calibration plane from measurements in the time domain is also explained.

Figure 3:
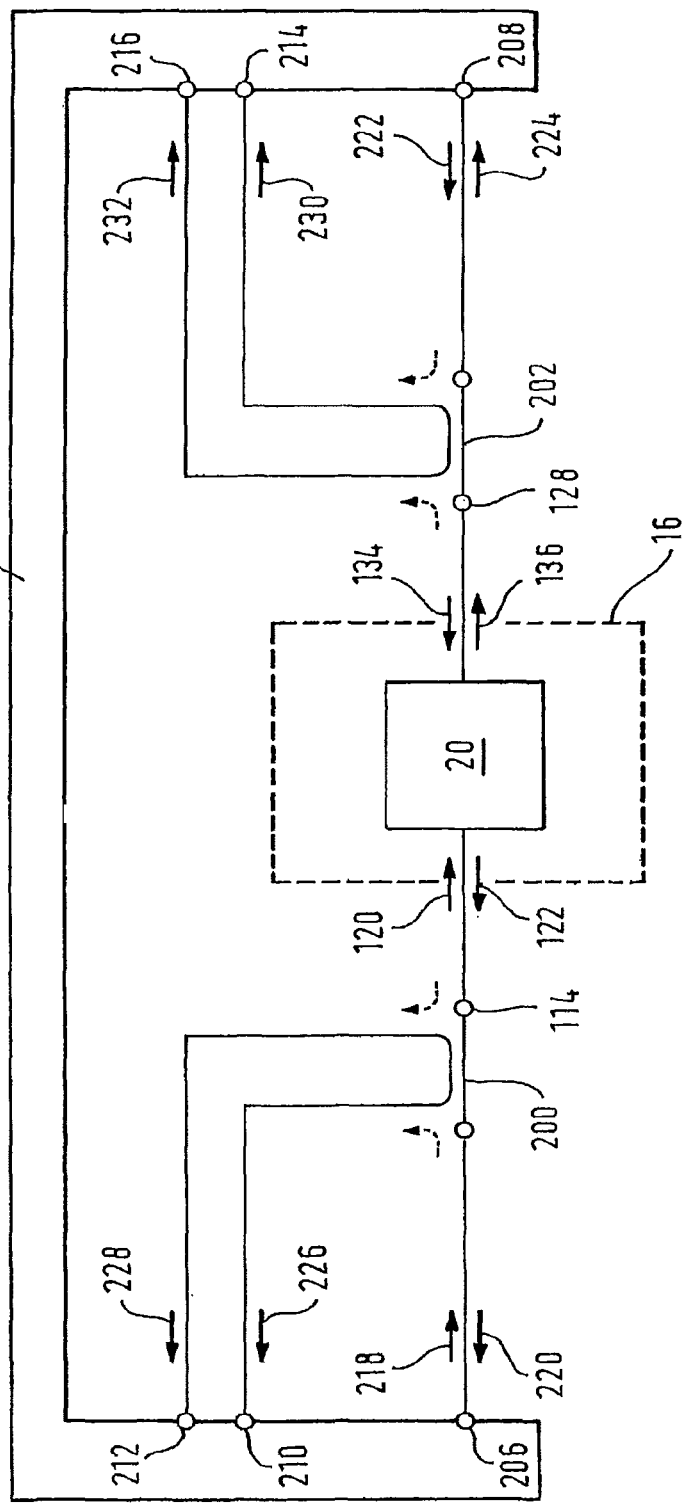
FIG. 3 shows a schematic circuit diagram of a circuit configuration for a calibration measurement.

On the basis of the known TRL calibration (TRL calibration method) explained above with reference to the equations (10) to (62), according to the invention a calibration method is suggested which allows the absolute wave quantities in the calibration plane 16 to be determined. The method according to the invention is based on the setup of a test apparatus as represented in FIG. 3. In FIG. 3, parts with the same function are identified with the same reference numbers as in FIG. 2, so that they can be explained with reference to the above description of FIG. 2. The DUT 20 is arranged in the calibration plane 16 and has in the calibration plane 16 the first port 114 and the second port 128. At the first port 114 of the DUT 20 in the calibration plane 16 a wave with the wave quantity $a_{DUT,1}$ 120 runs in and a wave with the wave quantity $b_{DUT,1}$ 122 runs out. At the second port 128 of the DUT 20 in the calibration plane 20 a wave with the wave quantity $a_{DUT,2}$ 134 runs in and a wave with the wave quantity $b_{DUT,2}$ 136 runs out.

The test apparatus comprises a first directional coupler 200 and a second directional coupler 202. In order to calibrate this test apparatus, a vectorial network analyzer (VNA) 204 is provided which has a first test port 206, a second test port 208, a third test port 210, a fourth test port 212, a fifth test port 214 and a sixth test port 216. The first directional coupler 200 is connected, in each case via a waveguide for electromagnetic waves, with the first port 114 of the DUT 20 in the calibration plane 16 and with the first test port 206 of the VNA. The second directional coupler 202 is connected, in each case via a waveguide for electromagnetic waves, with the second port 128 of the DUT 20 in the calibration plane 16 and with the second test port 208 of the VNA 204. At the first test port 206 of the VNA 204 a wave with the wave quantity $a_1$ 218 runs out and a wave with the wave quantity $b_1$ 220 runs in. At the second test port 208 of the VNA 204 a wave with the wave quantity $a_2$ 222 runs out and a wave with the wave quantity $b_2$ 224 runs in.

The first directional coupler 200 decouples a component of the wave $a_1$ 218 and feeds the decoupled wave to the third test port 210 of the VNA 204 as a wave with the wave quantity $a_{Mess,1}$ 226. The first directional coupler 200 also decouples a component of the wave $b_1$ 220 and feeds the decoupled wave to the fourth test port 212 of the VNA 204 as a wave with the wave quantity $b_{Mess,1}$ 228.

The second directional coupler 202 decouples a component of the wave $a_2$ 222 and feeds the decoupled wave to the fifth test port 214 of the VNA 204 as a wave with the wave quantity $a_{Mess,2}$ 230. The second directional coupler 202 also decouples a component of the wave $b_2$ 224 and feeds the decoupled wave to the sixth test port 216 of the VNA 204 as a wave with the wave quantity $b_{Mess,2}$ 232.

This test apparatus has four error two-ports, the error matrices $X_A$ and $X_B$ of which are to be determined through a calibration. A pair of error two-ports on both sides of the calibration plane 16 has already been described with reference to FIG. 2. A pair of such error two-ports as represented in FIG. 2 is located between the calibration plane 16 on the one hand and the first and second test ports 206, 208 of the VNA 204 on the other hand. A further pair of such error two-ports as represented in FIG. 2 is located between the calibration plane 16 on the one hand and the third/fourth as well as the fifth/sixth test ports 210/212, 214/216 on the other hand. The following applies to these four error two-ports under consideration:

The first pair of error two-ports between the DUT 20 and the first and second test ports 206, 208 of the VNA.

Test port A 112 corresponds to the first test port 206 of the VNA 204 and test port B 126 corresponds to the second test port 208 of the VNA 204, where $X_A$ is the error matrix $I_A$ with the matrix terms $x_{00}=i_{00}$, $x_{01}=i_{01}$, $x_{10}=i_{10}$, $x_{11}=i_{11}$ and $X_B$ is the error matrix $I_B$ with the matrix terms $x_{22}=i_{22}$, $x_{23}=i_{23}$, $x_{32}=i_{32}$, $x_{33}=i_{33}$. Also, $a_1$ 116 corresponds to $a_1$ 218, $b_1$ 118 corresponds to $b_1$ 220, $a_{II}$ 130 corresponds to $a_2$ 222 and $b_{II}$ 132 corresponds to $b_2$ 224. The following also applies to this first pair of error two-ports:

$$\begin{bmatrix} b_1 \\ a_{DUT,1} \end{bmatrix} = I_A \begin{bmatrix} a_1 \\ b_{DUT,1} \end{bmatrix} \quad (63)$$

$$I_A = \begin{bmatrix} i_{00} & i_{01} \\ i_{10} & i_{11} \end{bmatrix} \quad (64)$$

$$\begin{bmatrix} a_{DUT,2} \\ b_2 \end{bmatrix} = I_B \begin{bmatrix} b_{DUT,2} \\ a_2 \end{bmatrix} \quad (65)$$

$$I_B = \begin{bmatrix} i_{22} & i_{23} \\ i_{32} & i_{33} \end{bmatrix} \quad (66)$$

The second pair of error two-ports between the DUT 20 and the third/fourth as well as the fifth/sixth test ports 210/212, 214/216 of the VNA:

The test port A 112 corresponds to the third/fourth test port 210/212 of the VNA 204 and the test port B 126 corresponds to the fifth/sixth test port 214/216 of the VNA 205, where $X_A$ is the error matrix $E_A$ with the matrix terms $x_{00}=e_{00}$, $x_{01}=e_{01}$, $x_{10}=e_{10}$, $x_{11}=e_{11}$ and $X_B$ is the error matrix $E_B$ with the matrix terms $x_{22}=e_{22}$, $x_{23}=e_{23}$, $x_{32}=e_{32}$, $x_{33}=e_{33}$. Also, $a_I$ 116 corresponds to $a_{Mess,1}$ 226, $b_1$ 118 corresponds to $b_{Mess,1}$ 228, $a_{II}$ 130 corresponds to $a_{Mess,2}$ 230 and $b_{II}$ 132 corresponds to $b_{Mess,2}$ 232. The following also applies to this second pair of error two-ports:

$$\begin{bmatrix} b_{MESS,1} \\ a_{DUT,1} \end{bmatrix} = E_A \begin{bmatrix} a_{MESS,1} \\ b_{DUT,1} \end{bmatrix} \quad (67)$$

where $$E_A = \begin{bmatrix} e_{00} & e_{01} \\ e_{10} & e_{11} \end{bmatrix} \quad (68)$$

and $$\begin{bmatrix} a_{DUT,2} \\ B_{MESS,2} \end{bmatrix} = E_B \begin{bmatrix} b_{DUT,2} \\ a_{MESS,2} \end{bmatrix} \quad (69)$$

where $$E_B = \begin{bmatrix} e_{22} & e_{23} \\ e_{32} & e_{33} \end{bmatrix} \quad (70)$$

Two signal flow charts analogous to FIG. 2 are thus obtained.

FIG. 3 shows the desired wave quantities $a_{DUT,1}$ 120 and $b_{DUT,1}$ 122 (the wave quantities of the propagated and reflected waves on the left-hand side of the DUT 20, i.e. at the first port 114 of the DUT 20 in the calibration plane 20), as well as the desired wave quantities $a_{DUT,2}$ 134 and $b_{DUT,2}$ 136 (the wave quantities of the propagated and reflected waves on the right-hand side of the DUT 20, i.e. at the second port 128 of the DUT 20 in the calibration plane 20). These can be calculated with $$\begin{pmatrix} b_{DUT,1} \\ a_{DUT,1} \end{pmatrix} = T_A^{-1} \begin{pmatrix} b_{MESS,1} \\ a_{MESS,1} \end{pmatrix} \quad (71)$$

and $$\begin{pmatrix} a_{DUT,2} \\ b_{DUT,2} \end{pmatrix} = T_B \begin{pmatrix} a_{MESS,2} \\ b_{MESS,2} \end{pmatrix} \quad (72)$$

for the second pair of error two-ports, insofar as the transmission matrices $T_A$ and $T_B$ and the associated scatter matrices $E_A$ and $E_B$ are completely known.

The algorithm of the TRL calibration, as described with reference to the equations (10) to (62), is in each case used in order to obtain the elements of the matrices $I_A$ and $I_B$ or $E_A$ and $E_B$. The scatter parameters recorded by the VNA 204 for a given calibration standard K, where K="reflect", "line" or "thru", depending on the frequency f of the waves with the wave quantities $a_1$ 218 and $b_1$ 220 are identified as scatter parameters $S_{xy,K,f}$ where x=1, 2, 3, 4, 5 or 6 and y=1 or 2, between the y-th and the x-th test port of the VNA 204 for the calibration standard K and the frequency f. In this case the input scatter matrix $S_{I,K,f}$ of the TRL algorithm for the calculation of $I_A$ and $I_B$ is $$S_{I,K,f} = \begin{bmatrix} S_{11,K,f} & S_{12,K,f} \\ S_{21,K,f} & S_{22,K,f} \end{bmatrix} \quad (73)$$

If the terms of the matrices $E_A$ and $E_B$ are to be calculated, then the corresponding scatter matrix is $$S_{unkorr,K,f} = \begin{bmatrix} S_{11,unkorr,K,f} & S_{12,unkorr,K,f} \\ S_{21,unkorr,K,f} & S_{22,unkorr,K,f} \end{bmatrix} \quad (74)$$

with scatter parameters $S_{11,unkorr,K,f}$, $S_{12,unkorr,K,f}$, $S_{21,unkorr,K,f}$ and $S_{22,unkorr,K,f}$ which are calculated as follows $$S_{11,unkorr,K,f} = \frac{b_{MESS,1,K,f}}{a_{MESS,1,K,f}} = \frac{S_{41,K,f}}{S_{31,K,f}} = \sigma_{11} \quad (75)$$

$$S_{21,unkorr,K,f} = \frac{b_{MESS,2,K,f}}{a_{MESS,1,K,f}} = \frac{S_{61,K,f}}{S_{31,K,f}} = \sigma_{21} \quad (76)$$

$$S_{12,unkorr,K,f} = \frac{b_{MESS,1,K,f}}{a_{MESS,2,K,f}} = \frac{S_{42,K,f}}{S_{52,K,f}} = \sigma_{12} \quad (77)$$

$$S_{22,unkorr,K,f} = \frac{b_{MESS,2,k,f}}{a_{MESS,2,k,f}} = \frac{S_{62,K,f}}{S_{52,K,f}} = \sigma_{22} \quad (78)$$

The values $a_{Mess,1}$ 226, $b_{Mess,1}$ 228, $a_{Mess,2}$ 230 and $b_{Mess,2}$ 232 are also hereby assigned, through the index K, to a respective calibration standard K="reflect", "line" or "thru" and the index f identifies their dependency on the frequency f of the waves with the wave quantities $a_f$, $b_1$, $a_2$ and $b_2$ which are generated and fed in via the test ports 206 and 208. For the calibration measurements, these measured wave quantities $a_{Mess,1}$ 226, $b_{Mess,1}$ 228, $a_{Mess,2}$ 230 and $b_{Mess,2}$ 232 thus become $a_{Mess,1,K,f}$ 226, $b_{Mess,1,K,f}$ 228, $a_{Mess,2,K,f}$ 230 and $b_{Mess,2,K,f}$ 232.

In order to illustrate how the elements of the matrix (74) are composed, their values are stated once again in (79) depending on the different wave quantities (see FIG. 3).

$$S_{unkorr,K,f} = \begin{bmatrix} \dfrac{b_{mess,1,k,f}}{a_1} \cdot \dfrac{a_1}{a_{mess,1,K,f}} & \dfrac{b_{mess,1,K,f}}{a_2} \cdot \dfrac{a_2}{a_{mess,2,K,f}} \\ \dfrac{b_{mess,2,K,f}}{a_1} \cdot \dfrac{a_1}{a_{mess,1,K,f}} & \dfrac{b_{mess,2,K,f}}{a_2} \cdot \dfrac{a_2}{a_{mess,2,K,f}} \end{bmatrix} = \quad (79)$$

$$\begin{bmatrix} \dfrac{b_{mess,1,k,f}}{a_{mess,1,K,f}} & \dfrac{b_{mess,1,K,f}}{a_{mess,2,K,f}} \\ \dfrac{b_{mess,2,K,f}}{a_{mess,1,K,f}} & \dfrac{b_{mess,2,K,f}}{a_{mess,2,K,f}} \end{bmatrix}$$

In this case, however, this is not yet the input value of the TRL algorithm. First, $S_{unkorr,K,f}$ will, as will be shown in the following, be converted into a corrected scatter matrix $S_{c,K,f}$.

Both $S_{I,K,f}$ and $S_{unkorr,K,f}$ exist for each of the three standards which are to be measured, as indicated by the index K.

Here too, the TRL calibration can only provide the products $i_{01}i_{10}$ and $i_{23}i_{32}$ or $e_{01}e_{10}$ and $e_{23}e_{32}$. However, during the further course of the method, knowledge of the individual factors or the individual terms of $E_A$ and $E_B$ is desired. In order to obtain these, a "detour" via the decomposition of the terms from the I-matrices is used. If the products $i_{01}i_{10}$ and $i_{23}i_{32}$ are correctly decomposed, the terms of the E-matrices can also be isolated with the help of this information.

In order to be able to carry out this decomposition of the i-terms, use is made of a particular property of $I_A$ and $I_B$. In contrast to $E_A$ and $E_B$ the error matrices $I_A$ and $I_B$ describe two reciprocal two-ports, since they describe the relationship between the first test port 206 or the second test port 208 of the VNA 204 and the calibration plane 16. It can therefore be assumed that $$i_{01} = i_{10} = \pm\sqrt{i_{01}i_{10}} \quad (80)$$

and $$i_{23} = i_{32} = \pm\sqrt{i_{23}i_{32}} \quad (81)$$

The correct selection of the sign corresponds to the correct determination of the phase of the terms. If the phase at a frequency point is known with adequate precision, then it can be determined without error for the remaining points through continuous extrapolation. If the phase difference of the factors of the product $i_{01}i_{10}$ and $i_{23}i_{32}$ from one frequency point to the next thereby exceeds a threshold value, then it is reduced by 180°, because it is assumed that the individual frequency steps are sufficiently densely distributed that the threshold value should not normally be exceeded. It must hereby be ensured that the phase of the individual factors changes from point to point by less than 90°, since the rotation by 180° would otherwise be carried out incorrectly. For example, an initial phase determination can be carried out via the electrical length between a test port of the VNA and the calibration plane 16. It should also be ensured that if the phase is extrapolated to the frequency f=0 the phase is 0° at that point.

A different approach is chosen for the decomposition of the e-terms. The matrices $E_A$ and $E_B$ do not describe reciprocal or physically present two-ports. These matrices are created by means of various different mathematical operations in order to describe a relationship between the wave quantities in the calibration plane and those at the outputs of the directional couplers 200, 202.

The "reflect" calibration standards of a TRL calibration are one-port standards (EUL, H.-J.; SCHIEK, B.: "A generalized theory and new calibration procedures for network analyzer self-calibration", Microwave Theory and Techniques, IEEE transactions on 39 (1991), April, No. 4, p. 724-731). Thus, no transmission occurs from the left-hand side of the device under test to the right-hand side or vice versa, i.e. $S_{21,DUT} = S_{12,DUT} = 0$. The further calculation is therefore carried out here, by way of example, for the left-hand side of the test apparatus shown in FIG. 3 with the first port 114 of the DUT 20 in the calibration plane 16, but is to be applied analogously to the right-hand side of the test apparatus shown in FIG. 3 with the second port 128 of the DUT 20 in the calibration plane 16. In the case of the Reflect standard, the following relationships can be derived for the wave $a_{DUT,1}$ 120 from the signal flow diagram according to FIG. 2 with the definitions for the first and second pair of error two-ports as previously stated:

$$a_{DUT,1,reflect,f} = \frac{i_{10} a_{1,reflect,f}}{1 - i_{11} S_{11,DUT,reflect,f}} \quad (82)$$

$$a_{DUT,1,reflect,f} = \frac{e_{10} a_{Mess,1,reflect,f}}{1 - e_{11} S_{11,DUT,reflect,f}} \quad (83)$$

A definition for $e_{10}$ can now be derived from these two equations:

$$e_{10} = i_{10} \frac{a_1}{a_{MESS,1,reflect,f}} \frac{1 - e_{11} S_{11,DUT,reflect,f}}{1 - i_{11} S_{11,DUT,reflect,f}} \quad (84)$$

$$\frac{a_1}{a_{MESS,1,reflect,f}}$$

is thereby the reciprocal value of the scatter parameter $S_{31,Kf}$ determined by the VNA 204. The reflection coefficient of the Reflect standard, $S_{11,DUT}$, can also be determined with (24) from the terms already calculated using the TRL calibration. The product $e_{01}e_{10}$ obtained from the TRL calibration can now be divided by the result from (84). This means that all four elements of the matrix $E_A$ have been determined and the wave quantities $a_{DUT,1}$ 120 and $b_{DUT,1}$ 122 in the calibration plane 16 can now be determined from $a_{Mess,1,Kf}$ 226, and $b_{Mess,1,Kf}$ 228 with (71). As already mentioned, the calculation can be carried out analogously for the measurement at the second, fifth and sixth test ports 208, 214, 216 in order firstly to obtain $E_B$ and then, in a measurement, $a_{DUT,2}$ 134 and $b_{DUT,2}$ 136.

Figure 4:
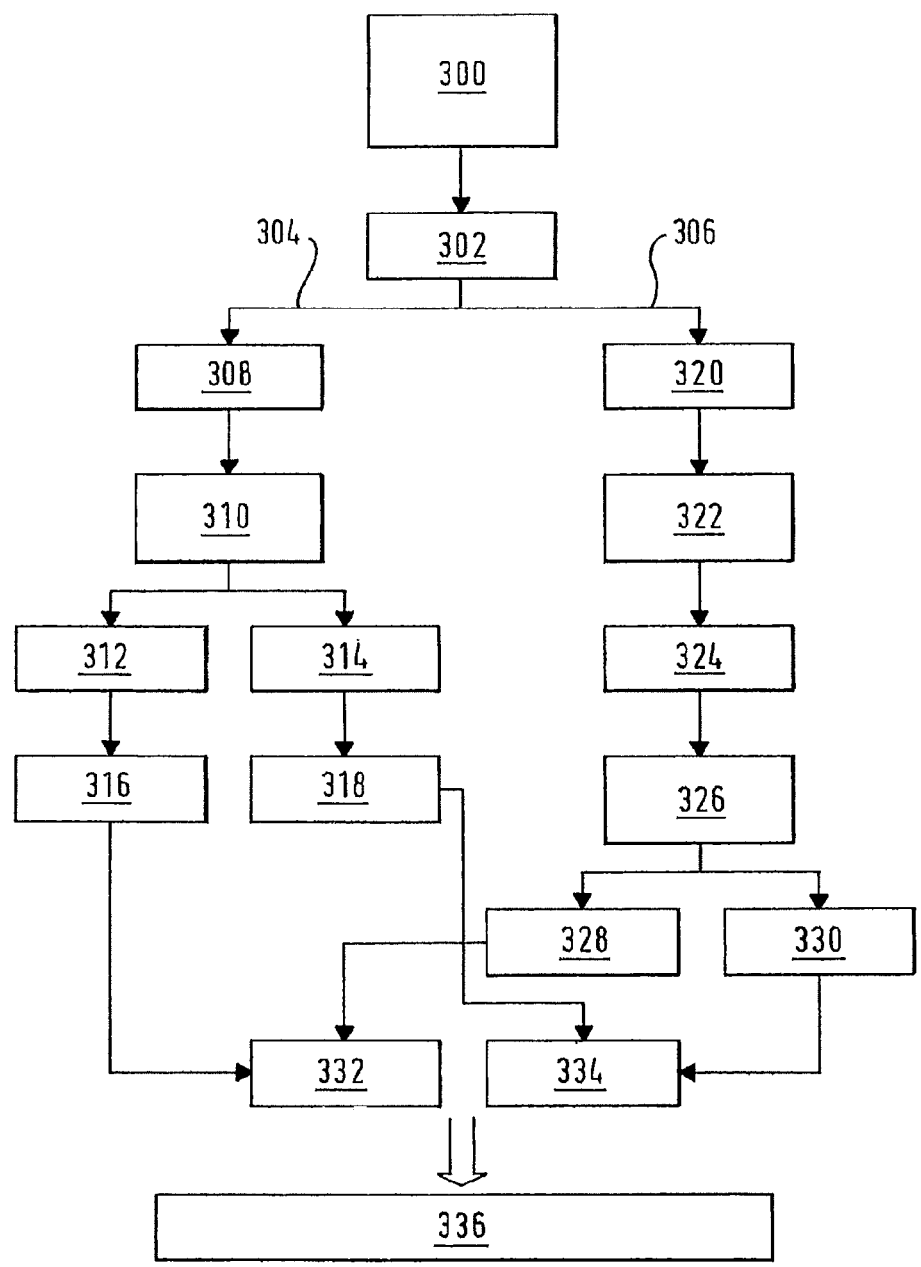
FIG. 4 shows a schematic flow chart for a preferred embodiment of the method according to the invention.

The entire sequence of the expanded calibration method is illustrated once again graphically in FIG. 4. In a block "Measurement of the standards with VNA" 300, the different calibration standards are used as DUT 16 in the calibration plane 16 and the scatter parameters $S_{xy,Kf}$ determined, where x=1, 2, 3, 4, 5 or 6 and y=1 or 2 and K="reflect", "line" or "thru". These terms are available in a block "$S_{xy,Kf}$" 302. Here, the method divides into two branches, a first branch 304 in order to determine the scatter matrices $I_A$ and $I_b$ and a second branch 306 in order to determine the scatter matrices $E_A$ and $E_B$.

In the first branch 304, the matrix $S_{I,Kf}$ is assembled from the scatter parameters $S_{xy,Kf}$ in a block "$S_{I,Kf}$" 308. In a block "TRL algorithm" 310, the matrix $S_{I,Kf}$ is used as input values for a TRL algorithm and the terms $i_{00}$, $i_{01} \cdot i_{10}$ and in as well as the terms $i_{22}$, $i_{23} \cdot i_{32}$ and $i_{33}$ are determined by means of the TRL algorithm. These are available in block "$I_A$" 312 and block "$I_B$" 314. The calculation of the individual terms $i_{01}$ and $i_{10}$ takes place in a block "Decomposition of $i_{01} \cdot i_{10}$" 316. The calculation of the individual terms $i_{23}$ and $i_{32}$ takes place in a block "Decomposition of $i_{23} \cdot i_{32}$" 318. The individual terms $i_{00}$, $i_{01}$, $i_{10}$ and $i_{11}$ as well as $i_{22}$, $i_{23}$, $i_{32}$ and $i_{33}$ of the error scatter matrices $I_A$ and $I_B$ are thus now completely determined.

In the second branch 306, the matrix $S_{unkorr,Kf}$ is assembled from the scatter parameters $S_{xy,Kf}$ in the block "$S_{unkorr,Kf}$" 320. In a block "Correction" 322, the corrected scatter matrix $S_{c,Kf}$ is determined from this scatter matrix $S_{unkorr,Kf}$ by means of a correction, which will be explained in more detail in the following, and is then available in the block "$S_{c,Kf}$" 324. This corrected scatter matrix then serves, in the block "TRL algorithm" 326, as input value for the TRL algorithm, with which the terms $e_{00}$, $e_{01} \cdot e_{10}$ and $e_{11}$ as well as the terms $e_{22}$, $e_{23} \cdot e_{32}$ and $e_{33}$ of the error scatter matrices $E_A$ and $E_B$ are determined and are available in block "$E_A$" 328 and in block "$E_B$" 330. The calculation of the individual terms $e_{01}$ and $e_{10}$ takes place in a block "Decomposition of $e_{01} \cdot e_{10}$" 332, where the results from block 316, i.e., the terms $i_{01}$ and $i_{10}$, are fed for this purpose. The calculation of the individual terms $e_{23}$ and $e_{32}$ takes place in a block "Decomposition of $e_{23} \cdot e_{32}$" 334, where the results from block 318, i.e. the terms $i_{23}$ and $i_{32}$, are fed for this purpose. All the individual terms of the four error scatter matrices $E_A$ and $E_B$ as well as $I_A$ and $I_B$ are thus then available in the block "Completely determined error matrices" 336. The calibration is completed and the individual terms of the four error scatter matrices $E_A$ and $E_B$ as well as $I_A$ and $I_B$ can be used for the correction of measuring results.

When it comes to carrying out a real measurement with the setup described here, one faces the challenge that network analyzers are usually only available with a maximum of four test ports. However, according to FIG. 3 six test ports are required on the VNA. This problem can be circumvented, since the wave quantities at the third test port 210 and at the fourth test port 212 need not necessarily be recorded at the same time as those at the fifth and sixth test ports 214, 216. Two test ports 206, 208 of the VNA are thereby permanently used at the first and second ports 114, 128 of the DUT 20 in the calibration plane of the test setup, while the other two test ports of the VNA are used for the sequential measurement first of $a_{Mess,1}$ 226 as well as $b_{Mess,1}$ 228 and then of $a_{Mess,2}$ 230 and $b_{Mess,2}$ 232. In each case, the uncontacted port of the directional couplers 200 and 202 must be terminated free of reflection in order to avoid distortion of the results.

Here follows an explanation of the correction of the scatter matrix $S_{unkorr,Kf}$ to obtain the corrected scatter matrix $S_{c,Kf}$.

In the calculation methods explained so far, the scatter parameters are used subject to the condition that $$S_{11} = \left. \frac{b_1}{a_1} \right|_{a_2 = 0} \quad (85)$$

However, for various reasons it can be the case that $a_2$ is unequal to zero. In such a case the determined quotient $$\frac{b_1}{a_2}$$

must be corrected by this influence before it actually represents the scatter parameter $S_{11}$.

If, in a setup, measurements are carried out both in a forwards direction and in a backwards direction, then the signal source of the VNA 204 which is used must be switched over to the first test port 206 or to the second test port 208. A terminating resistor of, usually, 50Ω is in each case connected to the port which is not excited. However, it cannot be guaranteed that source and termination in two system states display an identical matching to the respective test ports. Since these interfering influences classically occur as a result of the aforementioned switchover, the required correction factors are referred to as switch terms (MARKS, Roger B., "Formulations of the Basic Vector Network Analyzer Error Model including Switch Terms", ARFTG Conference Digest Fall, 50th vol. 32, 1997, p. 115-126).

In the setup referred to here, the switch terms assume particular importance due to the use of external directional couplers. Their non-ideal directivity ensures that for example despite an infeed at the first test port 206 an $a_{Mess,2}$ 230 different to zero is recorded even if the VNA 204 were to display a perfect matching to the second test port 208. This means that the measuring results would give the impression that there was in this case a wave which runs from the second test port 208 of the VNA to the DUT 20 ($a_{DUT,2}$ 134), even though a wave only exists which runs from the DUT 20 to the second test port 208 of the VNA 204 ($b_{DUT,2}$ 136). A fraction of the wave $b_{DUT,2}$ 136 has in this case, after being decoupled by the directional coupler, also run to its output connected to the fifth test port 214 of the VNA 204. In the case of an ideal directional coupler, the decoupled components of $b_{DUT,2}$ 136 would exclusively have run to the coupler output at the sixth test port 216 of the VNA 204. The non-ideal nature of the coupler which always occurs in reality can be compensated through the use of the switch terms.

If, for the sake of simplicity, one writes (74) generally as $$S_{unkorr,K,f} = \begin{bmatrix} \sigma_{11} & \sigma_{12} \\ \sigma_{21} & \sigma_{22} \end{bmatrix} \quad (86)$$

then according to MARKS (MARKS, Roger B., "Formulations of the Basic Vector Network Analyzer Error Model including Switch Terms", ARFTG Conference Digest Fall, 50th vol. 32, 1997, p. 115-126) through the scatter matrix $S_{c,K,f}$ corrected through use of switch terms, one obtains $$S_{c,K,f} = \frac{1}{D}\begin{bmatrix} \sigma_{11} - \sigma_{12}\sigma_{21}\Gamma_{F,K,f} & \sigma_{12} - \sigma_{11}\sigma_{12}\Gamma_{R,K,f} \\ \sigma_{21} - \sigma_{22}\sigma_{21}\Gamma_{F,K,f} & \sigma_{22} - \sigma_{12}\sigma_{21}\Gamma_{R,K,f} \end{bmatrix} \quad (87)$$

where $D=1-\sigma_{12}\sigma_{21}\Gamma_{F,K,f}\Gamma_{R,K,f}$ and $$\Gamma_{F,K,f} = \frac{S_{51,K,f}}{S_{61,K,f}}$$

describes the ratio of propagated to reflected wave measured at the output of the second directional coupler on feeding through the first test port of the VNA and $$\Gamma_{R,K,f} = \frac{S_{32,K,f}}{S_{42,K,f}}$$

describes the ratio of propagated to reflected wave measured at the output of the first directional coupler on feeding through the second test port of the VNA. $S_{xy,K,f}$ again stands for the scatter parameters measured by the VNA 204. The limited directivity of the directional couplers 200, 202 is expressed through $\Gamma_{F,K,f}$ and $\Gamma_{R,K,f}$.

The correction must be carried out individually for each frequency step f and for each calibration standard K. This correction does not need to be carried out for the calculation of the matrices $I_A$ and $I_B$, since in this case the VNA 204 already supplies correctly calculated scatter parameters ($S_{11,K,f}$, $S_{12,K,f}$, $S_{21,K,f}$, $S_{22,K,f}$).

Figure 5:
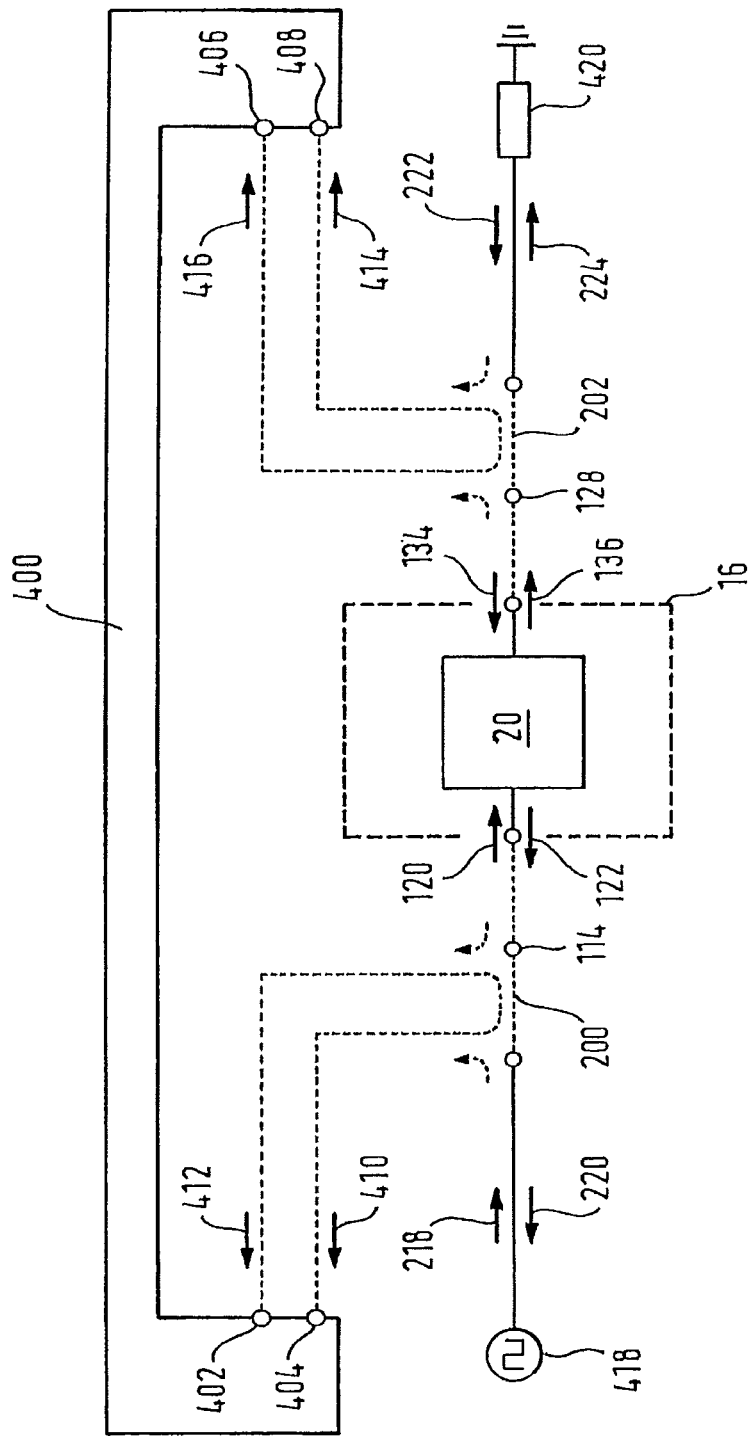
FIG. 5 shows a schematic circuit diagram of a circuit configuration for a measured value acquisition.

The setup for recording measured values in the time domain is represented in FIG. 5, analogously to FIG. 3 (calibration setup). Parts with the same function are identified with the same reference numbers as in FIG. 3, so that they can be explained with reference to the above description of FIG. 3.

Instead of a VNA, an oscilloscope 400 is used here which has a first channel 402, a second channel 404, a third channel 406 and a fourth channel 408. The first and second channels 402, 404 are in each case connected to an output of the first directional coupler 200 and the third and fourth channels 406, 408 are in each case connected to an output of the second directional coupler 202. In this way, the decoupled waves in the form of electrical voltages $v_3$ 410, $v_4$ 412, $v_5$ 414 and $v_6$ 416 can now be recorded on the first to fourth channels 402, 403, 404 and 406 respectively, as shown in FIG. 5. A signal source 418 is selectively connected to the first or second directional coupler 200, 202 and feeds in the wave with the wave quantity $a_1$ 218 at the first directional coupler 200 and (the wave with the wave quantity) $a_2$ 222 at the second directional coupler 202. The other directional coupler 202 or 200 in each case is then connected to a terminating resistor Z 420.

In order for the calibration to retain its validity, the parts of the setup indicated with the dotted line may no longer change following calibration with the VNA 204. Otherwise, the determined error terms would no longer describe the correct relationship between test ports and DUT plane. In contrast, however, changes in the signal source 418, in the terminating resistor 420, as well as their connecting cables to the respective directional couplers 200, 202 have no influence on the validity of the calibration coefficients.

In the following it is described how the currents and voltages in the calibration plane 16 are determined from the voltages measured in the time domain at the outputs of the couplers on the channels one to four 402, 404, 406, 408 of the oscilloscope 400.

For this purpose the recorded voltages $v_3$ 410, $v_4$ 412, $v_5$ 414 and $v_6$ 416 are in each case first interpolated to a time increment of $$\Delta t = \frac{0.5}{f_{max}},$$

where the highest frequency for which calibration data are available is described with $f_{max}$. If the voltages measured on channel i are designated $v_i$, where i=3, 4, 5, 6, then these can now be represented as vectors $\{v_i(k \cdot \Delta t)\}$. k hereby designates the running index over all N data points, where k= 1, . . . , N. A short-time Fourier transform is then carried out. The width of the window of the STFT should thereby comprise m data points. For example, the first m elements of the vectors $v_i$ are transformed into the frequency domain.

$$\{V_i(l \cdot \Delta f)\} = FFT\{v_i(n \cdot \Delta t)\} \quad (88)$$

For both running indices l and n, l,n=1, . . . ,m, since the number of frequency points following the transform corresponds with the number of data points in the time domain. The following results for the frequency increment $$\Delta f = \frac{2 f_{max}}{m} \quad (89)$$

The elements of the error matrices $E_A$ and $E_B$ are also matched to this frequency increment through interpolation. Through the FFT, the vectors $V_i$ first represent a symmetrical spectrum whose elements for $$1 \le l \le \frac{m}{2}$$

describe the frequency domain $0 \le f \le f_{max}$, while the elements for $$\frac{m}{2} < l \le m$$

represent the negative frequencies where $-f_{max} \le f \le 0$. Since only real values are considered here, it is sufficient only to take into consideration the frequency components where $f \ge 0$. It is also assumed that the inputs or channels 402, 404, 406, 408 of the oscilloscope 400 used for time domain measurement have the same impedance $Z_0$ as the cable itself, so that there is no wave reflected back from the test apparatus. The same assumption was already made in the calibration with regard to the test ports 206, 208, 210, 212, 214, 216 of the VNA 204. The wave quantities can then be calculated with $$a_{mess,1} = \frac{V_3}{\sqrt{Z_0}} \quad (90)$$

$$b_{mess,1} = \frac{V_4}{\sqrt{Z_0}} \quad (91)$$

$$a_{mess,2} = \frac{V_5}{\sqrt{Z_0}} \quad (92)$$

$$b_{mess,2} = \frac{V_6}{\sqrt{Z_0}} \quad (93)$$

These wave quantities can now be converted into the wave quantities in the calibration plane 16 of the DUT 20 with the aid of (71) and (72). The equations $$U_{DUT,2} = \sqrt{Z_0} (a_{DUT,1} + b_{DUT,1}) \quad (94)$$

$$I_{DUT,1} = \frac{1}{\sqrt{Z_0}} (a_{DUT,1} - b_{DUT,1}) \quad (95)$$

$$U_{DUT,2} = \sqrt{Z_0} (a_{DUT,2} + b_{DUT,2}) \quad (96)$$

$$I_{DUT,2} = \frac{1}{\sqrt{Z_0}} (a_{DUT,2} - b_{DUT,2}) \quad (97)$$

are used, finally, to calculate the currents and voltages in the calibration plane 16 from these wave quantities.

Due to the properties of the TRL calibration, the frequency domain for which calibration data is available is limited (see equation (10)). In the current and voltage vectors just calculated in the frequency domain, those elements which describe frequencies below the lowest calibration frequency must therefore be zeroed out. This ensures that no values are present in this frequency domain, for which no meaningful data can in any case be calculated.

Before the vectors are then transformed back into the time domain, these must first be mirrored so that they once again represent a symmetrical spectrum. Following the inverse Fourier transform of these values, one finally obtains the time-discrete currents and voltages on the device under test, which, like the input values, are once again present in k steps with the increment $\Delta t$:

$$u_{DUT,1}(k \cdot \Delta t) = IFFT\{U_{DUT,1}(l \cdot \Delta f)\} \quad (98)$$

$$i_{DUT,1}(k \cdot \Delta t) = IFFT\{I_{DUT,1}(l \cdot \Delta f)\} \quad (99)$$

$$u_{DUT,2}(k \cdot \Delta t) = IFFT\{U_{DUT,2}(l \cdot \Delta f)\} \quad (100)$$

$$i_{DUT,2}(k \cdot \Delta t) = IFFT\{I_{DUT,2}(l \cdot \Delta f)\} \quad (101)$$

The aforementioned window then moves forward by h points and the next block is transformed and calculated.

Although the actual measurement in the time domain is carried out with an oscilloscope, the calibration is carried out with a network analyzer, since this allows a greater dynamic range to be achieved.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for calibrating a test apparatus, having a first and a second directional coupler, for testing a two-port test object (DUT—Device Under Test), which has a first port and a second port in a calibration plane;

wherein for the purpose of calibrating the test apparatus a vectorial network analyzer (VNA) having a first, a second, a third, a fourth, a fifth and a sixth test port is connected to the first and second ports in the calibration plane such that the first test port is connected to the first port in the calibration plane, the second test port is connected to the second port in the calibration plane, the third and fourth test ports are connected to the first directional coupler and the fifth and sixth test ports are connected to the second directional coupler via a respective waveguide for electromagnetic waves;

wherein at the first test port an electromagnetic wave $a_1$ runs out in the direction of the first port in the calibration plane and an electromagnetic wave $b_1$ runs in from the direction of the first port in the calibration plane;

wherein at the second test port an electromagnetic wave $a_2$ runs out in the direction of the second port in the calibration plane and an electromagnetic wave $b_2$ runs in from the direction of the second port in the calibration plane;

wherein at the first port in the calibration plane an electromagnetic wave $a_{DUT,1}$ runs in from the direction of the first test port and an electromagnetic wave $b_{DUT,1}$ runs out in the direction of the first test port;

wherein at the second port in the calibration plane an electromagnetic wave $a_{DUT,2}$ runs in from the direction of the second test port and an electromagnetic wave $b_{DUT,2}$ runs out in the direction of the second test port;

wherein between the first test port and the first port in the calibration plane a component of the wave $a_1$ is coupled out by the first directional coupler as $a_{Mess,1}$ and fed to the third test port of the VNA;

wherein between the first test port and the first port in the calibration plane a component of the wave $b_1$ is coupled out by the first directional coupler as $b_{Mess,1}$ and fed to the fourth test port of the VNA;

wherein between the second test port and the second port in the calibration plane a component of the wave $a_2$ is coupled out by the second directional coupler as $a_{Mess,2}$ and fed to the fifth test port of the VNA;

wherein between the second test port and the second port in the calibration plane a component of the wave $b_2$ is coupled out by the second directional coupler as $b_{Mess,2}$ and fed to the sixth test port of the VNA;

wherein in order to calibrate the test apparatus, instead of the DUT at least three different calibration standards are arranged in the calibration plane;

wherein for each calibration standard K and for each desired frequency point of a frequency f of $a_1$ or $a_2$ scatter parameters $S_{xy,K,f}$, where x=1, 2, 3, 4, 5 or 6 and y=1 or 2, are determined between the y-th and the x-th test port of the VNA for the calibration standard K and the frequency f is determined from the known values $a_{1,K,f}$ and $a_{2,K,f}$ as well as from the measured values $b_{1,K,f}$, $b_{2,K,f}$, $a_{Mess,1,K,f}$, $b_{Mess,1,K,f}$, $a_{Mess,2,K,f}$, $b_{Mess,2,K,f}$ whereby $$\begin{bmatrix} b_{1,K,f} \\ b_{2,K,f} \end{bmatrix} = \begin{bmatrix} S_{11,K,f} & S_{12,K,f} \\ S_{21,K,f} & S_{22,K,f} \end{bmatrix} \begin{bmatrix} a_{1,K,f} \\ a_{2,K,f} \end{bmatrix}$$

$$\begin{bmatrix} a_{Mess,1,K,f} \\ b_{Mess,1,K,f} \end{bmatrix} = \begin{bmatrix} S_{31,K,f} & S_{32,K,f} \\ S_{41,K,f} & S_{42,K,f} \end{bmatrix} \begin{bmatrix} a_{1,K,f} \\ a_{2,K,f} \end{bmatrix}$$

$$\begin{bmatrix} a_{Mess,2,K,f} \\ b_{Mess,2,K,f} \end{bmatrix} = \begin{bmatrix} S_{51,K,f} & S_{52,K,f} \\ S_{61,K,f} & S_{62,K,f} \end{bmatrix} \begin{bmatrix} a_{1,K,f} \\ a_{2,K,f} \end{bmatrix}$$

wherein a scatter matrix $S_{unkorr,K,f}$ $$S_{unkorr,K,f} = \begin{bmatrix} S_{11,unkorr,K,f} & S_{12,unkorr,K,f} \\ S_{21,unkorr,K,f} & S_{22,unkorr,K,f} \end{bmatrix},$$

describing the transmission via the directional coupler is calculated from the measured scatter parameters $S_{xy,K,f}$ of the calibration standards, where x=3, 4, 5, 6 and y=1, 2, with scatter parameters $S_{11,unkorr,K,f}$, $S_{12,unkorr,K,f}$, $S_{21,unkorr,K,f}$ and $S_{22,unkorr,K,f}$ according to $$S_{11,unkorr,K,f} = \frac{b_{MESS,1,K,f}}{a_{MESS,1,K,f}} = \frac{S_{42,K,f}}{S_{32,K,f}} = \sigma_{11}$$

$$S_{21,unkorr,K,f} = \frac{b_{MESS,2,K,f}}{a_{MESS,2,K,f}} = \frac{S_{61,K,f}}{S_{31,K,f}} = \sigma_{21}$$

$$S_{12,unkorr,K,f} = \frac{b_{MESS,1,K,f}}{a_{MESS,2,K,f}} = \frac{S_{42,K,f}}{S_{32,K,f}} = \sigma_{12}$$

$$S_{22,unkorr,K,f} = \frac{b_{MESS,2,K,f}}{a_{MESS,2,K,f}} = \frac{S_{62,K,f}}{S_{52,K,f}} = \sigma_{22}$$

whereby a scatter matrix $S_{I,K,f}$ describing the transmission between the first test port of the VNA and the first port in the calibration plane on the one hand, as well as between the second test port of the VNA and the second port in the calibration plane on the other hand, is determined with the measured scatter parameters $S_{xy,K,f}$ of the calibration standards, where x=1, 2 and y=1, 2, as $$S_{I,K,f} = \begin{bmatrix} S_{11,K,f} & S_{12,K,f} \\ S_{21,K,f} & S_{22,K,f} \end{bmatrix}$$

whereby, with the measured scatter parameters $S_{xy,K,f}$ of the scatter matrix $S_{I,K,f}$, where x=1, 2 and y=1, 2, terms $i_{00}$, $i_{01} \cdot i_{10}$ and $i_{11}$ of an error matrix $I_A$ with $$I_A = \begin{bmatrix} i_{00} & i_{01} \\ i_{10} & i_{11} \end{bmatrix}$$

are determined for a signal transmission between the first test port on the one hand and the first port in the calibration plane on the other hand depending on a frequency f of the waves $a_1$ or $a_2$ by means of a predetermined calibration algorithm, where $I_A$ is a scatter matrix according to $$\begin{bmatrix} b_1 \\ a_{DUT,1} \end{bmatrix} = I_A \begin{bmatrix} a_1 \\ b_{DUT,1} \end{bmatrix}$$

whereby, with the measured scatter parameters $S_{xy,K,f}$ of the scatter matrix $S_{I,K,f}$, where x=1, 2 and y=1, 2, terms $i_{22}$, $i_{23} \cdot i_{32}$ and $i_{33}$ of an error matrix $I_B$ with $$I_B = \begin{bmatrix} i_{22} & i_{23} \\ i_{32} & i_{33} \end{bmatrix}$$

are determined for a signal transmission between the second test port on the one hand and the second port in the calibration plane on the other hand depending on a frequency f of the waves $a_1$ or $a_2$ by means of a predetermined calibration algorithm, whereby $I_B$ is a scatter matrix according to $$\begin{bmatrix} a_{DUT,2} \\ b_2 \end{bmatrix} = I_B \begin{bmatrix} b_{DUT,2} \\ a_2 \end{bmatrix}$$

such that for each frequency step with the frequency f of $a_1$ or $a_2$ and for each calibration standard K a correction of the scatter matrix $S_{unkorr,K,f}$ is carried out to produce a corrected scatter matrix $S_{c,K,f}$ according to the formula $$S_{c,K,f} = \frac{1}{D} \begin{bmatrix} \sigma_{11} - \sigma_{12}\sigma_{21}\Gamma_{F,K,f} & \sigma_{12} - \sigma_{11}\sigma_{12}\Gamma_{R,K,f} \\ \sigma_{21} - \sigma_{22}\sigma_{21}\Gamma_{F,K,f} & \sigma_{22} - \sigma_{12}\sigma_{21}\Gamma_{R,K,f} \end{bmatrix}$$

where $D = 1 - \sigma_{12}\sigma_{21}\Gamma_{F,K,f}\Gamma_{R,K,f}$, and $$\Gamma_{F,K,f} = \frac{S_{51,K,f}}{S_{61,K,f}}$$

describes the ratio of propagated to reflected wave measured at the output of the second directional coupler on feeding through the first test port of the VNA and $$\Gamma_{R,K,f} = \frac{S_{32,K,f}}{S_{42,K,f}}$$

describes the ratio of propagated to reflected wave measured at the output of the first directional coupler on feeding through the second test port of the VNA;

whereby, with the scatter parameters of the scatter matrix $S_{c,K,f}$, terms $e_{00}$, $e_{01} \cdot e_{10}$ and $e_{11}$ of an error matrix $$E_A = \begin{bmatrix} e_{00} & e_{01} \\ e_{10} & e_{11} \end{bmatrix}$$

are determined for a signal transmission between the third and fourth test port on the one hand and the first port in the calibration plane on the other hand depending on a frequency f of the waves $a_1$ or $a_2$ by means of a predetermined calibration algorithm, where $E_A$ is a scatter matrix according to $$\begin{bmatrix} b_{MESS,1} \\ a_{DUT,1} \end{bmatrix} = E_A \begin{bmatrix} a_{MESS,1} \\ b_{DUT,1} \end{bmatrix}$$

whereby, with the scatter parameters of the scatter matrix $S_{c,K,f}$, terms $e_{22}$, $e_{23} \cdot e_{32}$ and $e_{33}$ of an error matrix $$E_B = \begin{bmatrix} e_{22} & e_{23} \\ e_{32} & e_{33} \end{bmatrix}$$

are determined for a signal transmission between the fifth and sixth test port on the one hand and the second port in the calibration plane on the other hand depending on a frequency f of the waves $a_1$ or $a_2$ by a predetermined calibration algorithm, whereby $E_B$ is a scatter matrix according to $$\begin{bmatrix} a_{DUT,2} \\ b_{MESS,2} \end{bmatrix} = E_B \begin{bmatrix} b_{DUT,2} \\ a_{MESS,2} \end{bmatrix}$$

whereby the isolated terms $i_{01}$ and $i_{10}$ from the product $i_{01} \cdot i_{10}$ as well as the isolated terms $i_{23}$ and $i_{32}$ from the product $i_{23} \cdot i_{32}$ are determined according to the formulas $$i_{01} = i_{10} = \pm \sqrt{i_{10} i_{10}}$$

And $$i_{23} = i_{32} = \pm \sqrt{i_{23} i_{32}}$$

whereby the sign is in each case determined starting out from a frequency point with known phase through continuous extrapolation, whereby a phase difference from one frequency point to a next frequency point is reduced by 180° if this phase difference exceeds a predetermined threshold value;

whereby the isolated term $e_{10}$ is calculated from the product $e_{10} \cdot e_{01}$ according to the formula $$e_{10} = i_{10} \cdot \frac{a_1}{a_{MESS,1}} \cdot \frac{1 - e_{11} S_{11,DUT,K^*}}{1 - i_{11} S_{11,DUT,K^*}}$$

and the isolated term $e_{01}$ is determined from this, whereby $$S_{11,DUT,K^*} = \frac{(S_{11,K^*,f} - i_{00})}{(i_{10} \cdot i_{01} + i_{11} \cdot (S_{11,K^*,f} - i_{00}))}$$

and K* designates a calibration standard without transmission;

whereby the isolated term $e_{23}$ from the product $e_{32} \cdot e_{23}$ is calculated according to the formula $$e_{23} = i_{23} \cdot \frac{a_2}{a_{MESS,2}} \cdot \frac{1 - e_{22} S_{22,DUT,K^*}}{1 - i_{22} S_{22,DUT,K^*}}$$

and the isolated term $e_{23}$ is determined from this, whereby $$S_{22,DUT,K^*} = \frac{(S_{22,K^*,f} - i_{22,f})}{(i_{32} \cdot i_{23} + i_{33} \cdot (S_{22,K^*,f} - i_{22,f}))}$$

and K* designates a calibration standard without transmission.

2. The method of claim 1, wherein through switching, the third and fourth test ports of the VNA can in addition be used as fifth and sixth test ports, so that the waves $a_{Mess,1}$ and $b_{Mess,1}$ are measured at the third and fourth test ports of the VNA at a different time from the waves $a_{Mess,2}$ and $b_{Mess,2}$ at the fifth and sixth test ports of the VNA.

3. The method of claim 1, wherein the terms $e_{00}$, $e_{01} \cdot e_{10}$ and $e_{11}$ of the error matrix $E_A$ and the terms $e_{22}$, $e_{23} \cdot e_{32}$ and $e_{33}$ of the error matrix $E_B$ are determined by a TRL algorithm from the corrected scatter matrix $S_{c,K,f}$.

4. The method of claim 1 wherein the terms $i_{00}$, $i_{01} \cdot i_{10}$ and $i_{11}$ of the error matrix $I_A$ and the terms $i_{22}$, $i_{23} \cdot i_{32}$ and $i_{33}$ of the error matrix $I_B$ are determined by means of a TRL algorithm from the scatter matrix $S_{I,K,f}$.

5. The method of claim 3 including using three different calibration standards of the following type for the TRL algorithm: a first calibration standard of the type "thru" (through-connection), a second calibration standard of the type "reflect" (unmatched termination) and a third calibration standard of the type "line" (delay line), whereby the reflection coefficient of the calibration standard "reflect" is unequal to zero, whereby a phase of the reflection at the calibration standard "reflect" is precisely determined in advance to +/−90°, whereby the identical calibration standard "reflect" is used for all test ports of the VNA, whereby a line impedance of the calibration standard "thru" substantially corresponds to a line impedance of the calibration standard "line", whereby the electrical length of the calibration standard "thru" is by definition 0, whereby an electrical length of the calibration standard "line" is unequal to $$n \cdot \frac{\lambda}{2},$$

where λ=wavelength and n is a whole number greater than or equal to 1, where K="reflect", "line" or "thru" and K*="reflect".

6. The method of claim 5, wherein for a difference $\Delta\varphi$ in the electrical length of the calibration standard "line" in relation to the electrical length of the calibration standard "thru", $$(n-1)\frac{\lambda}{2} + \delta < \Delta\varphi < n \cdot \frac{\lambda}{2} - \delta$$

where δ≥20°.

7. The method of claim 5 wherein the TRL algorithm determines the output values $E_A$ and $E_B$ or $I_A$ and $I_B$ from the input values $S_{c,K,f}$ or $S_{I,K,f}$ as follows:

the terms of the matrices $E_A$, $E_B$ or $I_A$ and $I_B$ are determined through the terms of their respective transmission matrices $T_A$ and $T_B$ with $$T_A = \begin{bmatrix} r_{11} & r_{12} \\ r_{21} & r_{22} \end{bmatrix} = r_{22} \begin{bmatrix} a & b \\ c & 1 \end{bmatrix}$$

and $$T_B = \begin{bmatrix} \rho_{11} & \rho_{12} \\ \rho_{21} & \rho_{22} \end{bmatrix} = \rho_{22} \begin{bmatrix} \alpha & \beta \\ \gamma & 1 \end{bmatrix}$$

where $$\begin{bmatrix} b_{DUT,1} \\ a_{DUT,1} \end{bmatrix} = T_A^{-1} \begin{bmatrix} b_{MESS,1} \\ a_{MESS,1} \end{bmatrix}$$

$$\begin{bmatrix} a_{DUT,2} \\ b_{DUT,2} \end{bmatrix} = T_B \begin{bmatrix} a_{MESS,2} \\ b_{MESS,2} \end{bmatrix}$$

applies for $T_A$=transmission matrix of $E_A$ and $T_B$=transmission matrix of $E_B$ and where $$\begin{bmatrix} b_{DUT,1} \\ a_{DUT,1} \end{bmatrix} = T_A^{-1} \begin{bmatrix} b_1 \\ a_1 \end{bmatrix}$$

$$\begin{bmatrix} a_{DUT,2} \\ b_{DUT,2} \end{bmatrix} = T_B \begin{bmatrix} a_2 \\ b_2 \end{bmatrix}$$

applies for $T_A$=transmission matrix of $I_A$ and $T_B$=transmission matrix of $I_B$ and where, for a desired system-error-free transmission matrix of the DUT in the calibration plane $T_{DUT}$, $$T_{DUT} = \frac{1}{r_{22}\rho_{22}} \frac{1}{a\alpha} \frac{1}{1-b\frac{c}{a}} \frac{1}{1-\gamma\frac{\beta}{\alpha}} \begin{bmatrix} 1 & -b \\ -c & a \end{bmatrix} T_M \begin{bmatrix} 1 & -\beta \\ -\gamma & \alpha \end{bmatrix}$$

where $T_M$ is a transmission matrix which is determined from a scatter matrix measured at the test ports of the VNA;

whereby, in order to determine the seven values a, b, c, $\alpha$, $\beta$, $\gamma$, $r_{22}\rho_{22}$, a transmission matrix $T_T$ for the calibration standard "thru" and a transmission matrix $T_D$ for the calibration standard "line" is determined from scatter matrices for these calibration standards, in each case measured at the test ports of the VNA, where $$T_T = T_A T_B = g \begin{bmatrix} d & e \\ f & 1 \end{bmatrix}$$

$$T_D = T_A T_L T_B$$

$$T_D T_T^{-1} = T_{DT} = \begin{bmatrix} t_{11} & t_{12} \\ t_{21} & t_{22} \end{bmatrix}$$

where $T_L$ is a transmission matrix of the calibration standard "line" in the calibration plane and is defined as $$T_L = T_{DUT,D} = \begin{bmatrix} e^{-\bar{\gamma}l} & 0 \\ 0 & e^{+\bar{\gamma}l} \end{bmatrix}$$

where l is the actual physical length of the line and $\bar{\gamma}$ the propagation constant where $\bar{\gamma}=\bar{\alpha}+j\bar{\beta}$, where $\bar{\alpha}$ is a damping constant and $\bar{\beta}$ is a phase constant;

whereby in order to determine b the lesser solution in terms of amount, and in order to determine a/c the greater solution in terms of amount to the quadratic equation $$t_{21}x^2 + (t_{22}-t_{11})x - T_{12} = 0$$

is calculated;

whereby in order to determine $r_{22}\rho_{22}$ the equation $$r_{22}\rho_{22} = g \frac{1 - e\frac{c}{a}}{1 - b\frac{c}{a}}$$

is calculated;

whereby in order to determine $\gamma$, $\beta/\alpha$ and $a\alpha$ the equations $$\gamma = \frac{f - \frac{c}{a}d}{1 - \frac{c}{a}e}$$

$$\frac{\beta}{\alpha} = \frac{e - b}{d - bf}$$

$$a\alpha = \frac{d - bf}{1 - \frac{c}{a}e}$$

are calculated;

whereby in order to determine a the values $b_{Mess,1,reflect,f}$ and $a_{Mess,1,reflect,f}$ as well as $b_{Mess,2,reflect,f}$ and $a_{Mess,2,reflect,f}$ for the transmission-free calibration standard "reflect" with a reflection coefficient $\Gamma_R$, the sign of which is known, are measured through the error two-ports with the error matrices $E_A$ and $E_B$, and the values $w_1$ and $w_2$ are calculated according to $$w_1 = \frac{b_{MESS,1,reflect,f}}{a_{MESS,1,reflect,f}} = \frac{\alpha\Gamma_R + b}{c\Gamma_R + 1}$$

$$w_2 = \frac{b_{MESS,2,reflect,f}}{a_{MESS,2,reflect,f}} = \frac{\alpha\Gamma_R - \gamma}{\beta\Gamma_R - 1}$$

whereby the amount of a is calculated according to $$a = \pm \sqrt{\frac{w_1 - b}{w_2 + \gamma} \frac{1 + w_2\frac{\beta}{\alpha}}{1 - w_1\frac{c}{a}} \frac{d - bf}{1 - \frac{c}{a}e}}$$

whereby the sign of a is determined through insertion of the two possible results for a in the equation $$\Gamma_R = \frac{w_1 - b}{a\left(1 - w_1\frac{c}{a}\right)}$$

in that the respective sign is compared with the known sign for $\Gamma_R$ and, if these correspond, this sign is determined for a, where c is determined from the known value for a and α/c is determined,
whereby in order to determine α and β the equations $$\alpha = \frac{1}{a} \frac{d - bf}{1 - \frac{c}{a}e}$$

$$\beta = \alpha \frac{e - b}{d - bf}$$

are calculated;
whereby the terms of the transmission matrices $T_A$ and $T_B$ are determined from the values a, b, c, α, β, γ, $r_{22}\rho_{22}$, whereby the terms of the associated scatter matrices $E_A$ and $E_B$ or $I_A$ and $I_B$ are calculated from the terms of the transmission matrices $T_A$ and $T_B$ by means of the conversion relationship between scatter matrix and transmission matrix.

8. The method of claim 7 wherein the reflection coefficient is hereby $\Gamma_R = S_{11,DUT}$ for the reflection measurement through the error two-port with the error matrix $E_A$, and $\Gamma_R = S_{22,DUT}$ for the reflection measurement through the error two-port with the error matrix $E_B$, where $S_{11,DUT}$ and $S_{22,DUT}$ are terms of the scatter matrix $S_{DUT}$ $$S_{DUT} = \begin{bmatrix} S_{11,DUT} & S_{12,DUT} \\ S_{21,DUT} & S_{22,DUT} \end{bmatrix}$$

of the DUT in the calibration plane.

9. The method of claim 2, wherein the terms $e_{00}$, $e_{01} \cdot e_{10}$ and $e_{11}$ of the error matrix $E_A$ and the terms $e_{22}$, $e_{23} \cdot e_{32}$ and $e_{33}$ of the error matrix $E_B$ are determined by a TRL algorithm from the corrected scatter matrix $S_{c,K,f}$.

10. The method of claim 9 wherein the terms $i_{00}$, $i_{01} \cdot i_{10}$ and $i_{11}$ of the error matrix $I_A$ and the terms $i_{22}$, $i_{23} \cdot i_{32}$ and $i_{33}$ of the error matrix $I_B$ are determined by means of a TRL algorithm from the scatter matrix $S_{I,K,f}$.

11. The method of claim 4 including using three different calibration standards of the following type for the TRL algorithm: a first calibration standard of the type "thru" (through-connection), a second calibration standard of the type "reflect" (unmatched termination) and a third calibration standard of the type "line" (delay line), whereby the reflection coefficient of the calibration standard "reflect" is unequal to zero, whereby a phase of the reflection at the calibration standard "reflect" is precisely determined in advance to +/−90°, whereby the identical calibration standard "reflect" is used for all test ports of the VNA, whereby a line impedance of the calibration standard "thru" substantially corresponds to a line impedance of the calibration standard "line", whereby the electrical length of the calibration standard "thru" is by definition 0, whereby an electrical length of the calibration standard "line" is unequal to $$n \cdot \frac{\lambda}{2},$$

where λ=wavelength and n is a whole number greater than or equal to 1, where K="reflect", "line" or "thru" and K*="reflect".

12. The method of claim 3 including using three different calibration standards of the following type for the TRL algorithm: a first calibration standard of the type "thru" (through-connection), a second calibration standard of the type "reflect" (unmatched termination) and a third calibration standard of the type "line" (delay line), whereby the reflection coefficient of the calibration standard "reflect" is unequal to zero, whereby a phase of the reflection at the calibration standard "reflect" is precisely determined in advance to +/−90°, whereby the identical calibration standard "reflect" is used for all test ports of the VNA, whereby a line impedance of the calibration standard "thru" substantially corresponds to a line impedance of the calibration standard "line", whereby the electrical length of the calibration standard "thru" is by definition 0, whereby an electrical length of the calibration standard "line" is unequal to n·λ/2, where λ=wavelength and n is a whole number greater than or equal to 1, where K="reflect", "line" or "thru" and K*="reflect".

* * * * *

UNITED STATES PATENT AND TRADEMARK OFFICE
CERTIFICATE OF CORRECTION

PATENT NO. : 9,921,287 B2
APPLICATION NO. : 14/914181
DATED : March 20, 2018
INVENTOR(S) : Christian Zietz et al.

It is certified that error appears in the above-identified patent and that said Letters Patent is hereby corrected as shown below:

In the Specification

In Column 5 Line 25:

$$S_{c,K,f} = \frac{1}{D}\begin{bmatrix} \sigma_{11} - \sigma_{12}\sigma_{21}\Gamma_{F,K,f} & \sigma_{12} - \sigma_{11}\sigma_{12}\Gamma_{F,K,f} \\ \sigma_{21} - \sigma_{22}\sigma_{21}\Gamma_{F,K,f} & \sigma_{22} - \sigma_{12}\sigma_{21}\Gamma_{E,K,f} \end{bmatrix}$$

Should be:

$$S_{c,K,f} = \frac{1}{D}\begin{bmatrix} \sigma_{11} - \sigma_{12}\sigma_{21}\Gamma_{F,K,f} & \sigma_{12} - \sigma_{11}\sigma_{12}\Gamma_{R,K,f} \\ \sigma_{21} - \sigma_{22}\sigma_{21}\Gamma_{F,K,f} & \sigma_{22} - \sigma_{12}\sigma_{21}\Gamma_{R,K,f} \end{bmatrix}$$

In Column 8 Line 53:

$$T_T = T_A T_B = g \begin{bmatrix} d & e \\ f & 1 \end{bmatrix}$$

$$T_D = T_A T_L T_B$$

$$T_D T_T^{-1} = T_{DT} = \begin{bmatrix} t_{11} & t_{12} \\ t_{21} & t_{22} \end{bmatrix}$$

$$T_D T_T^{-1} = T_{DT} = \begin{bmatrix} t_{11} & t_{12} \\ t_{21} & t_{22} \end{bmatrix}$$

Signed and Sealed this
Second Day of April, 2019

Andrei Iancu
*Director of the United States Patent and Trademark Office*

Should be:

$$T_T = T_A T_B = g \begin{bmatrix} d & e \\ f & 1 \end{bmatrix}$$

$$T_D = T_A T_L T_B$$

$$T_D T_T^{-1} = T_{DT} = \begin{bmatrix} t_{11} & t_{12} \\ t_{21} & t_{22} \end{bmatrix}$$

In Column 9 Line 21:

$$\gamma = \frac{f - \frac{c}{a} d}{1 - \frac{c}{a} e}$$

$$a\alpha = \frac{d - bf}{1 - \frac{c}{a} e}$$

Should be:

$$\gamma = \frac{f - \frac{c}{a} d}{1 - \frac{c}{a} e}$$

$$\frac{\beta}{\alpha} = \frac{e - b}{d - bf}$$

$$a\alpha = \frac{d - bf}{1 - \frac{c}{a} e}$$

In Column 27 Line 93:

$$a_{mess,1} = \frac{V_3}{\sqrt{Z_0}}$$

$$b_{mess,1} = \frac{V_4}{\sqrt{Z_0}}$$

$$a_{mess,2} = \frac{V_5}{\sqrt{Z_0}}$$

$$b_{mess,2} = \frac{V_6}{\sqrt{Z_0}}$$

Should be:

$$a_{mess,1} = \frac{V_3}{\sqrt{Z_0}}$$

$$b_{mess,1} = \frac{V_4}{\sqrt{Z_0}}$$

$$a_{mess,2} = \frac{V_5}{\sqrt{Z_0}}$$

$$a_{mess,2} = \frac{V_6}{\sqrt{Z_0}}$$

In the Claims

In Claim 1 in Column 29 Line 53:

$$S_{11,unkorr,K,f} = \frac{b_{MESS,1,K,f}}{a_{MESS,1,K,f}} = \frac{S_{42,K,f}}{S_{32,K,f}} = \sigma_{11}$$

$$S_{21,unkorr,K,f} = \frac{b_{MESS,2,K,f}}{a_{MESS,2,K,f}} = \frac{S_{61,K,f}}{S_{31,K,f}} = \sigma_{21}$$

$$S_{12,unkorr,K,f} = \frac{b_{MESS,1,K,f}}{a_{MESS,2,K,f}} = \frac{S_{42,K,f}}{S_{32,K,f}} = \sigma_{12}$$

$$S_{22,unkorr,K,f} = \frac{b_{MESS,2,K,f}}{a_{MESS,2,K,f}} = \frac{S_{62,K,f}}{S_{52,K,f}} = \sigma_{22}$$

Should be:

$$S_{11,unkorr,K,f} = \frac{b_{MESS,1,K,f}}{a_{MESS,1,K,f}} = \frac{S_{41,K,f}}{S_{31,K,f}} = \sigma_{11}$$

$$S_{21,unkorr,K,f} = \frac{b_{MESS,2,K,f}}{a_{MESS,1,K,f}} = \frac{S_{61,K,f}}{S_{31,K,f}} = \sigma_{21}$$

$$S_{12,unkorr,K,f} = \frac{b_{MESS,1,K,f}}{a_{MESS,2,K,f}} = \frac{S_{42,K,f}}{S_{\underline{52},K,f}} = \sigma_{12}$$

$$S_{22,unkorr,K,f} = \frac{b_{MESS,2,K,f}}{a_{MESS,2,K,f}} = \frac{S_{62,K,f}}{S_{52,K,f}} = \sigma_{22}$$

In Claim 8 Column 35 Line 21:
8. The method of claim 7 wherein the reflection coefficient is hereby $\Gamma_R = S_{11,DUT}$ for the reflection measurement through the error two-port with the error matrix $E_A$, and $\Gamma_R = S_{22,DUT}$ for the reflection measurement through the error two-port with the error matrix $E_R$, where $S_{11,DUT}$ and $S_{22,DUT}$ are terms of the scatter matrix $S_{DUT}$ $$S_{DUT} = \begin{bmatrix} S_{11,DUT} & S_{12,DUT} \\ S_{21,DUT} & S_{22,DUT} \end{bmatrix}$$

of the DUT in the calibration plane.
Should be:
8. The method of claim 7 wherein the reflection coefficient is hereby $\Gamma_R = S_{11,DUT}$ for the reflection measurement through the error two-port with the error matrix $E_A$, and $\Gamma_R = S_{22,DUT}$ for the reflection measurement through the error two-port with the error matrix $E_B$, where $S_{11,DUT}$ and $S_{22,DUT}$ are terms of the scatter matrix $S_{DUT}$ $$S_{DUT} = \begin{bmatrix} S_{11,DUT} & S_{12,DUT} \\ S_{21,DUT} & S_{22,DUT} \end{bmatrix}$$

of the DUT in the calibration plane.